US 8,445,848 B2

(12) United States Patent
Tsuji

(10) Patent No.: US 8,445,848 B2
(45) Date of Patent: May 21, 2013

(54) INFRARED ARRAY SENSOR

(75) Inventor: Koji Tsuji, Suita (JP)

(73) Assignee: Panasonic Corporation, Kadoma-shi (JP)

( * ) Notice: Subject to any disclaimer, the term of this patent is extended or adjusted under 35 U.S.C. 154(b) by 0 days.

(21) Appl. No.: 13/262,301

(22) PCT Filed: Mar. 30, 2010

(86) PCT No.: PCT/JP2010/055671
§ 371 (c)(1),
(2), (4) Date: Sep. 30, 2011

(87) PCT Pub. No.: WO2010/113938
PCT Pub. Date: Oct. 7, 2010

(65) Prior Publication Data
US 2012/0018636 A1    Jan. 26, 2012

(30) Foreign Application Priority Data

Mar. 31, 2009    (JP) ................................ 2009-087008

(51) Int. Cl.
*G01J 5/00* (2006.01)
(52) U.S. Cl.
USPC ...................................................... 250/338.3
(58) Field of Classification Search
USPC ................. 250/330, 332, 338.1, 338.3, 338.4
See application file for complete search history.

(56) References Cited

U.S. PATENT DOCUMENTS

| 5,220,188 | A |   | 6/1993  | Higashi et al. |           |
|-----------|---|---|---------|----------------|-----------|
| 5,485,010 | A |   | 1/1996  | Owen et al.    |           |
| 6,163,061 | A |   | 12/2000 | Iida           |           |
| 6,690,014 | B1| * | 2/2004  | Gooch et al.   | 250/338.4 |
| 6,703,554 | B2|   | 3/2004  | Morita et al.  |           |
| 6,777,681 | B1| * | 8/2004  | Schimert et al.| 250/338.4 |
| 7,332,717 | B2|   | 2/2008  | Murata et al.  |           |
| 2007/0114416 | A1 | | 5/2007 | Ohta et al.    |           |
| 2007/0125949 | A1 | | 6/2007 | Murata et al.  |           |
| 2007/0170361 | A1 | | 7/2007 | Honda et al.   |           |
| 2008/0130710 | A1 | | 6/2008 | Dewes et al.   |           |
| 2008/0317087 | A1 | | 12/2008| Kimura         |           |

FOREIGN PATENT DOCUMENTS

| CN | 1898538 A    | 1/2007  |
|----|--------------|---------|
| EP | 1045233 A2   | 10/2000 |
| GB | 2359192 A    | 8/2001  |
| JP | 60-186723 A  | 9/1985  |
| JP | 02-205729 A  | 8/1990  |

(Continued)

OTHER PUBLICATIONS

International Search Report dated Jun. 29, 2010, issued for PCT/JP2010/055671.

(Continued)

*Primary Examiner* — David Porta
*Assistant Examiner* — Faye Boosalis
(74) *Attorney, Agent, or Firm* — Edwards Wildman Palmer LLP

(57) ABSTRACT

An infrared array sensor includes: a base substrate; cavities which have array structure and are formed on a surface side of the base substrate; and pixel parts supported by the base substrate to cover the cavities, respectively. Each of the pixel parts includes a membrane structure that includes segmented membrane structures divided by slits. Each of the segmented membrane structures includes a thermosensor. Each membrane structure of the pixel parts includes a coupling piece for connecting its own segmented membrane structures to each other.

12 Claims, 23 Drawing Sheets

FOREIGN PATENT DOCUMENTS

| | | |
|---|---|---|
| JP | 2576259 B2 | 12/1991 |
| JP | 04-76065 U | 7/1992 |
| JP | 05-164605 A | 6/1993 |
| JP | 06-213707 A | 8/1994 |
| JP | 06-229821 A | 8/1994 |
| JP | 07-099346 A | 4/1995 |
| JP | 07-507868 A | 8/1995 |
| JP | 3682296 B2 | 8/1995 |
| JP | 07-273306 A | 10/1995 |
| JP | 07-324978 A | 12/1995 |
| JP | 08-166284 A | 6/1996 |
| JP | 3287173 B2 | 10/1996 |
| JP | 10-242534 A | 9/1998 |
| JP | 11-040539 A | 2/1999 |
| JP | 11-191644 A | 7/1999 |
| JP | 11-326064 A | 11/1999 |
| JP | 2000-065639 A | 3/2000 |
| JP | 2000-298062 A | 10/2000 |
| JP | 2000-340848 A | 12/2000 |
| JP | 2001-153722 A | 6/2001 |
| JP | 2001-309122 A | 11/2001 |
| JP | 2002-168716 A | 6/2002 |
| JP | 2002-176204 A | 6/2002 |
| JP | 2002-340668 A | 11/2002 |
| JP | 2003-304005 A | 10/2003 |
| JP | 2006-300623 A | 11/2006 |
| JP | 2006-317232 A | 11/2006 |
| JP | 3897055 B1 | 3/2007 |
| JP | 3897056 B1 | 3/2007 |
| JP | 2007-132865 A | 5/2007 |
| JP | 2007-139455 A | 6/2007 |
| JP | 2007-178323 A | 7/2007 |
| JP | 2007-315916 A | 12/2007 |
| JP | 2008-082791 A | 4/2008 |
| JP | 2008-107307 A | 5/2008 |
| JP | 2010-078451 A | 4/2010 |
| WO | WO-2010/035738 A1 | 4/2010 |
| WO | WO-2010/035739 A1 | 4/2010 |

OTHER PUBLICATIONS

International Search Report of PCT/JP2010/055803 dated Jun. 6, 2012.

P. M. Sarro et al., "An Integrated Thermal Infrared Sensing Array," Sensors and Actuators, vol. 14 No. 2, 1998, pp. 191-201.

European Search Report of Application No. 09816153.2 dated Jun. 27, 2012.

European Search Report of Application No. 09816154.0 dated Jun. 27, 2012.

International Search Report of PCT/JP2009/066509 dated Oct. 27, 2009.

International Search Report of PCT/JP2009/066510 dated Oct. 27, 2009.

Office Action dated Dec. 21, 2012, issued for the corresponding Korean patent application.

Notification of the First Office Action dated Jan. 31, 2013, issued for the corresponding Chinese patent application No. 200980142269.0 and English translation thereof.

* cited by examiner

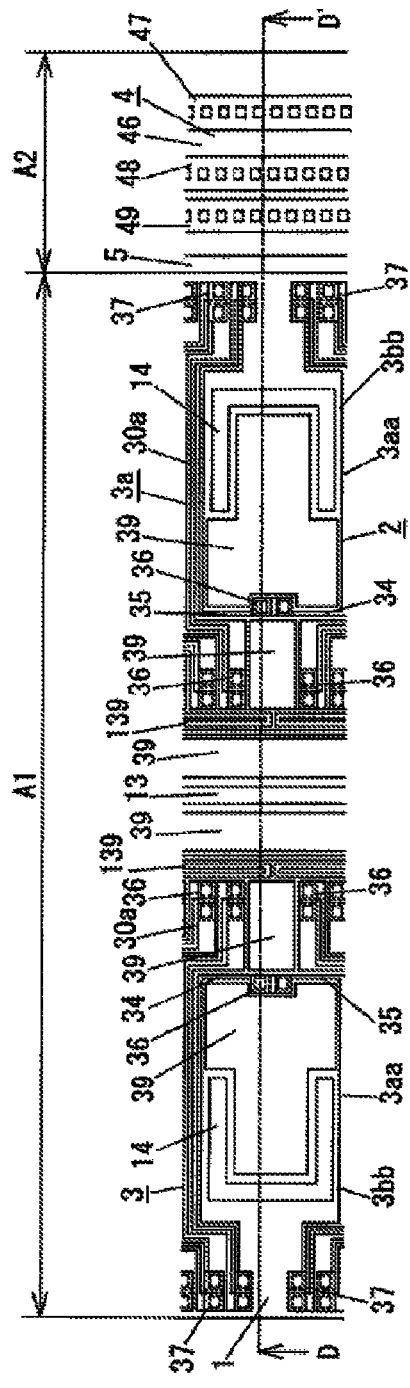
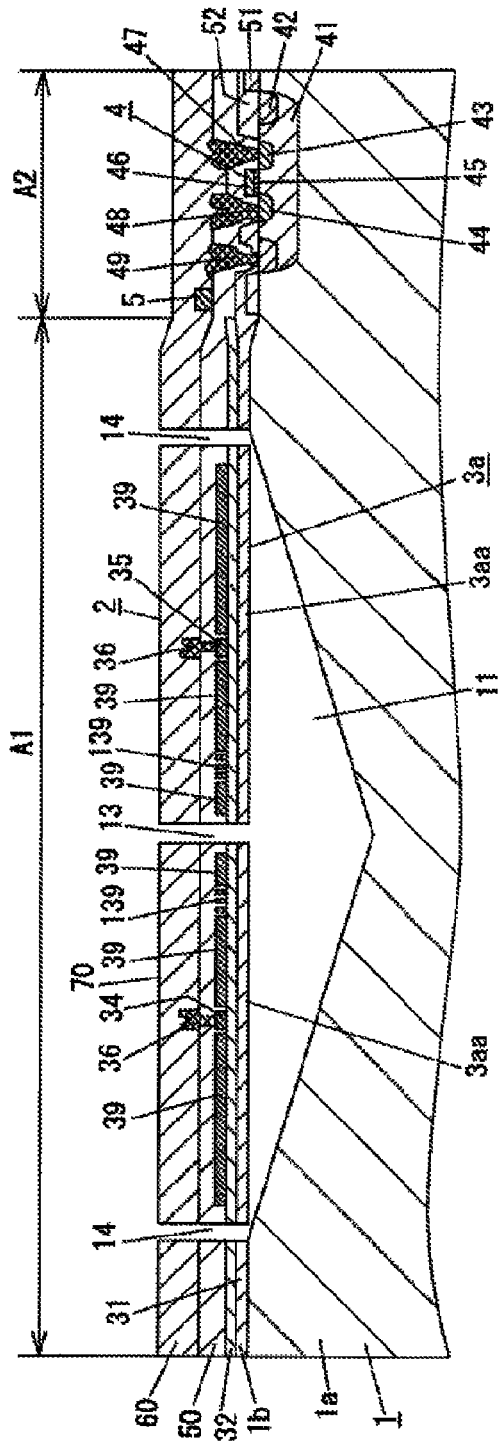

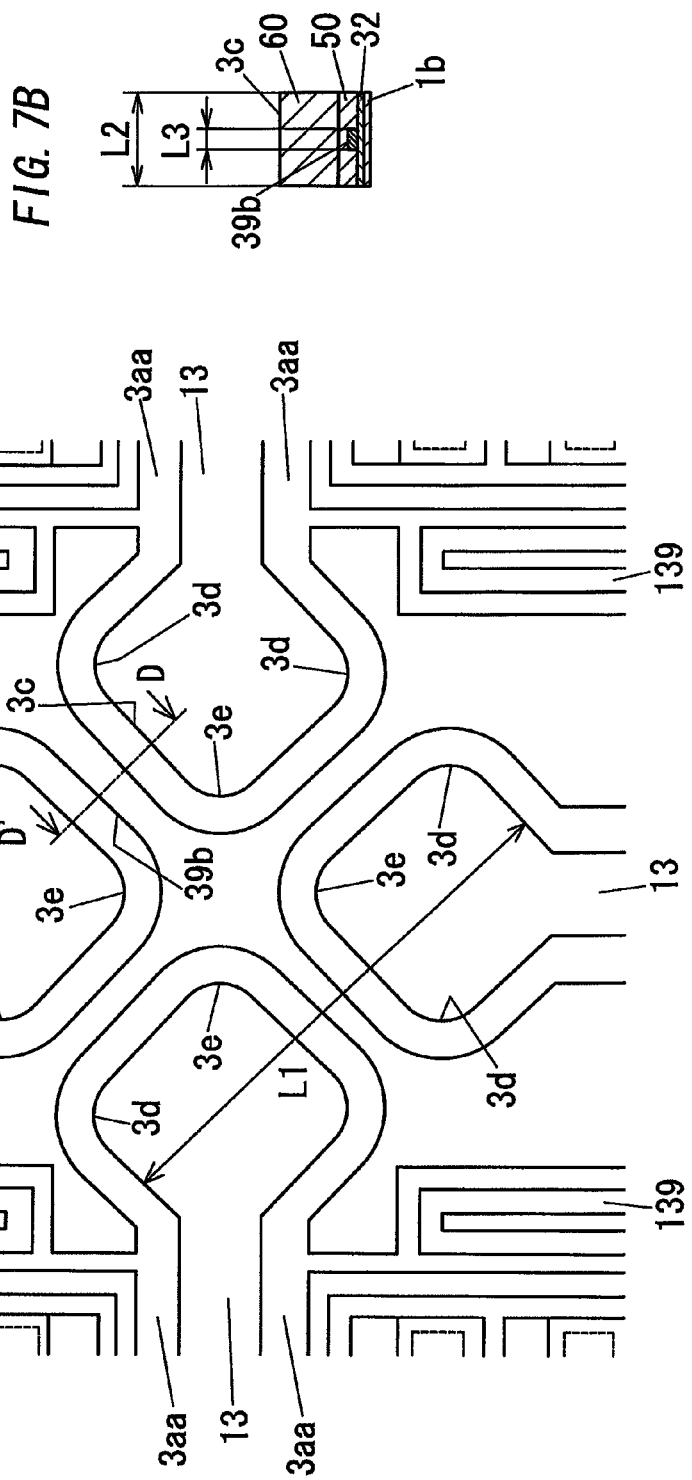

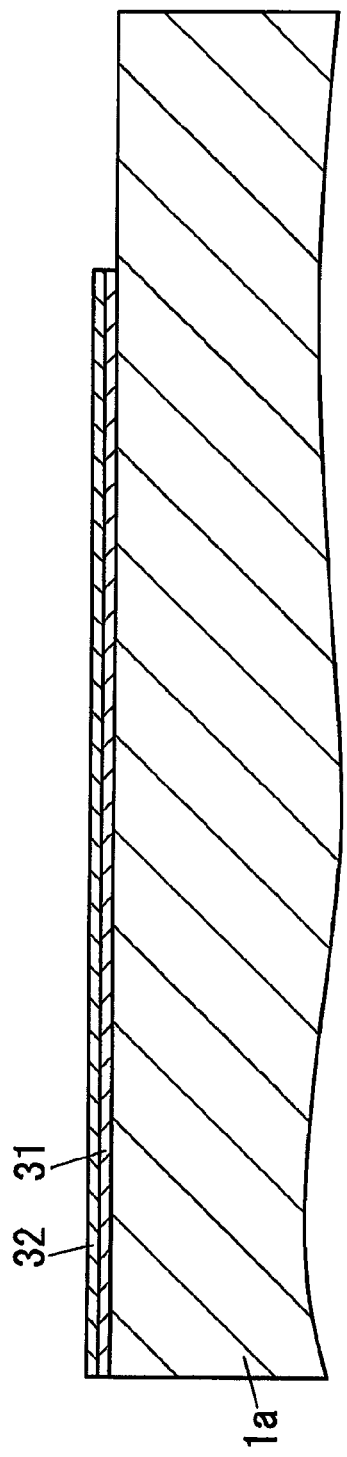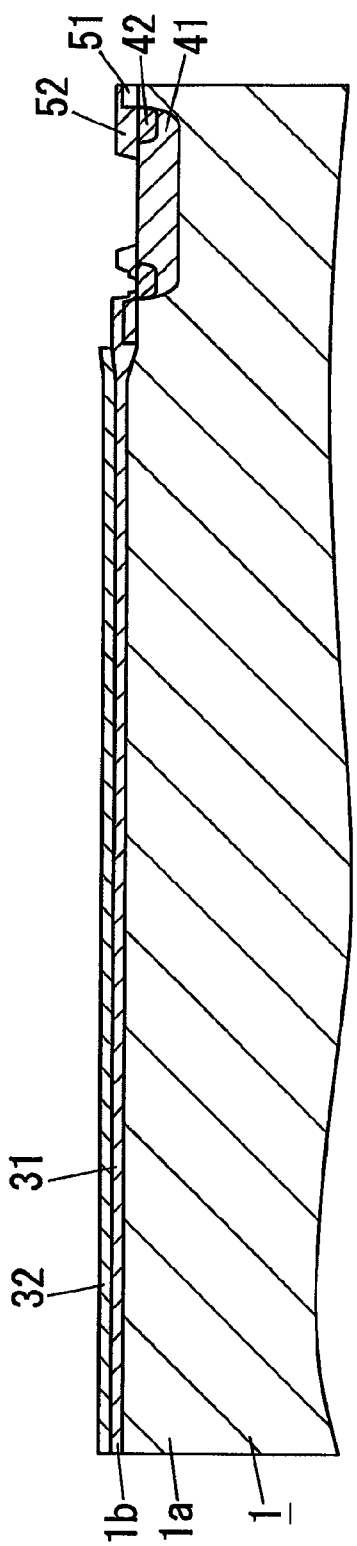

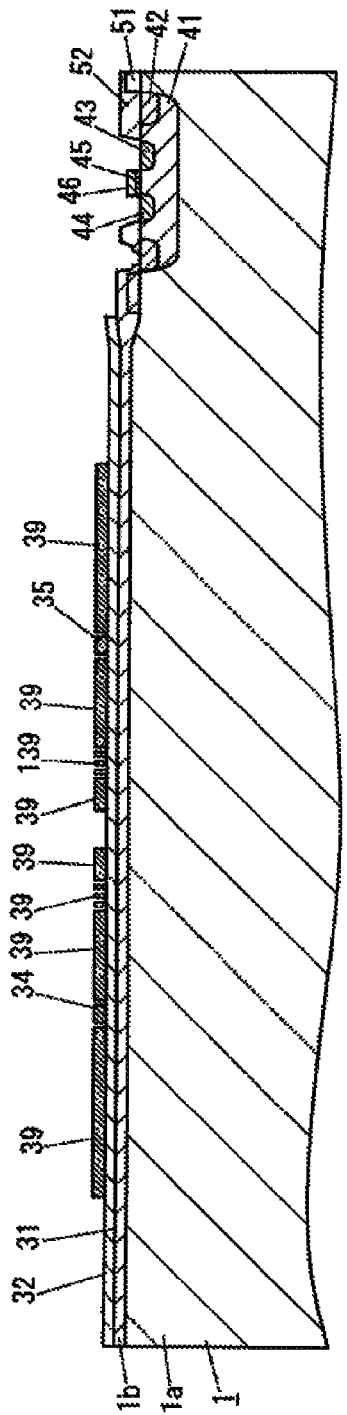
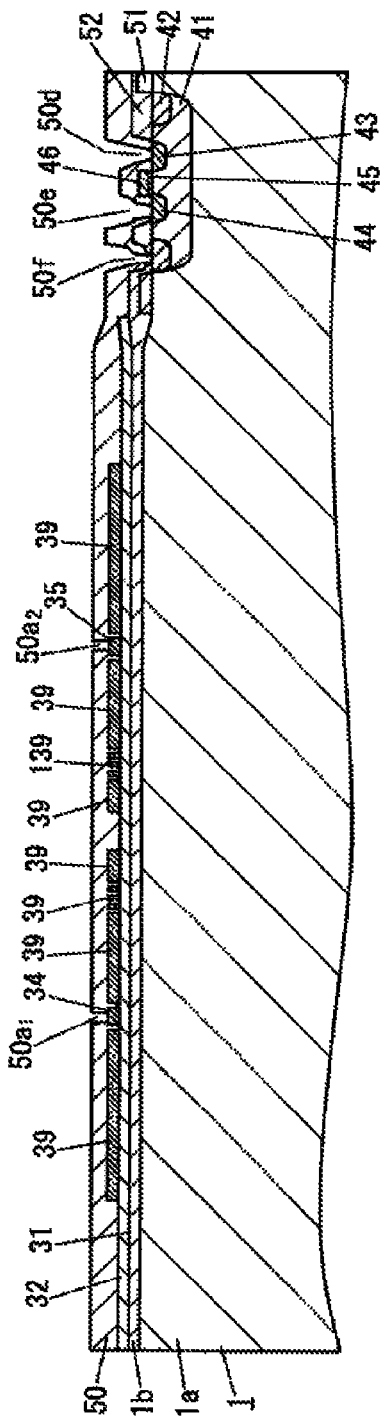
FIG. 16A
FIG. 16B

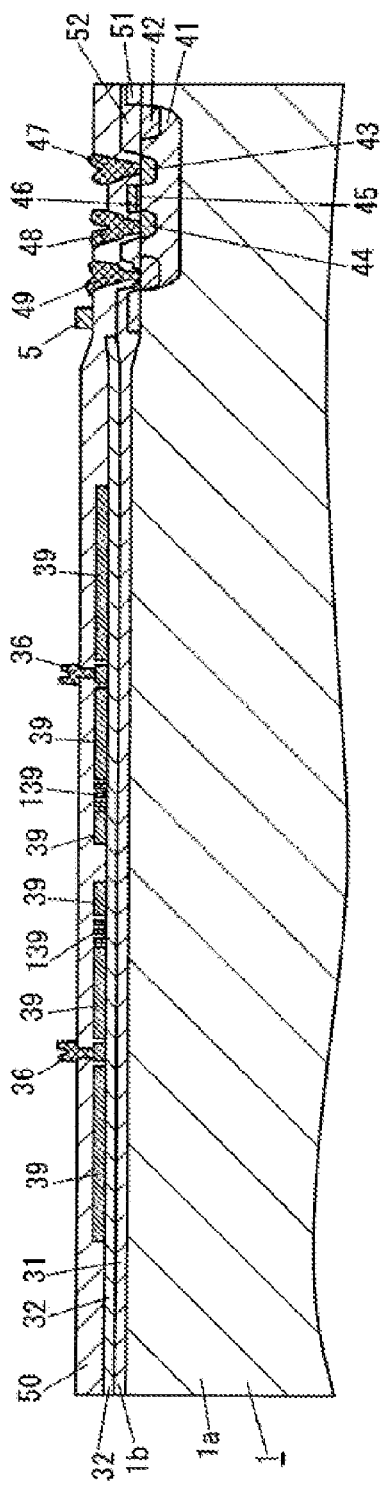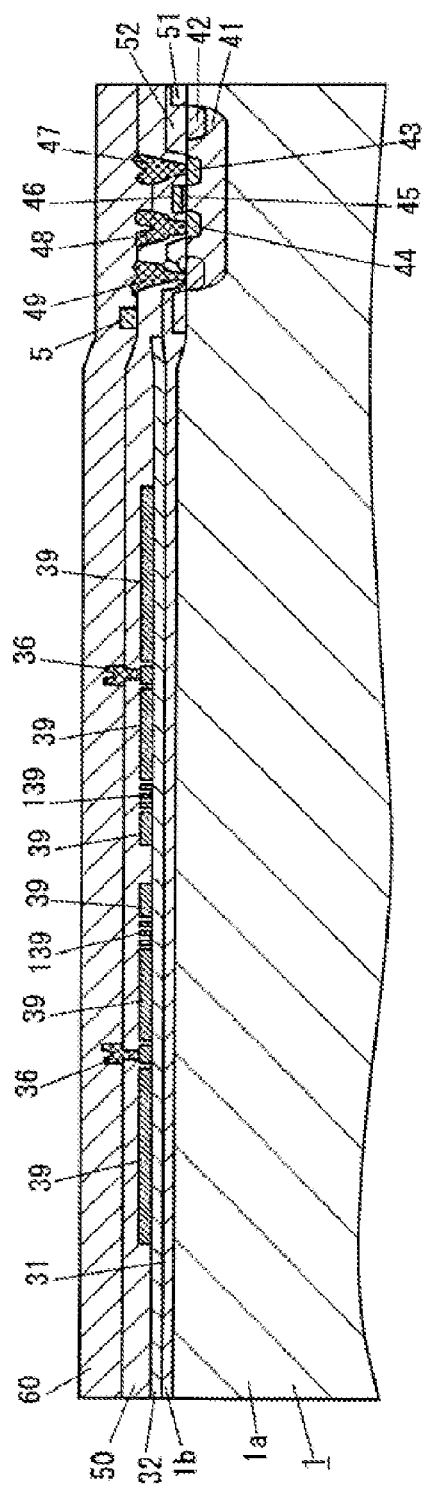

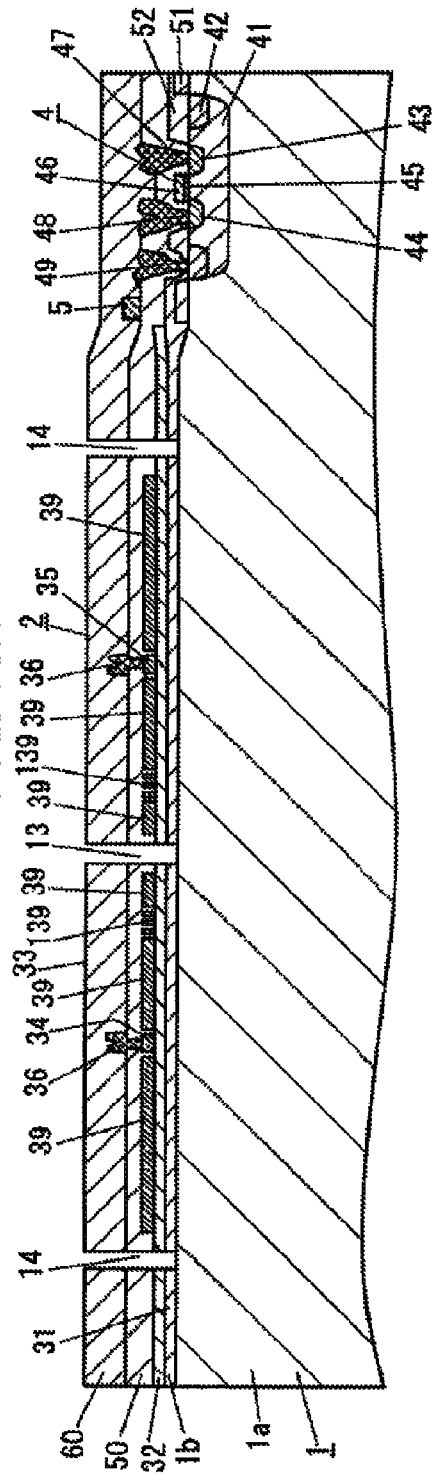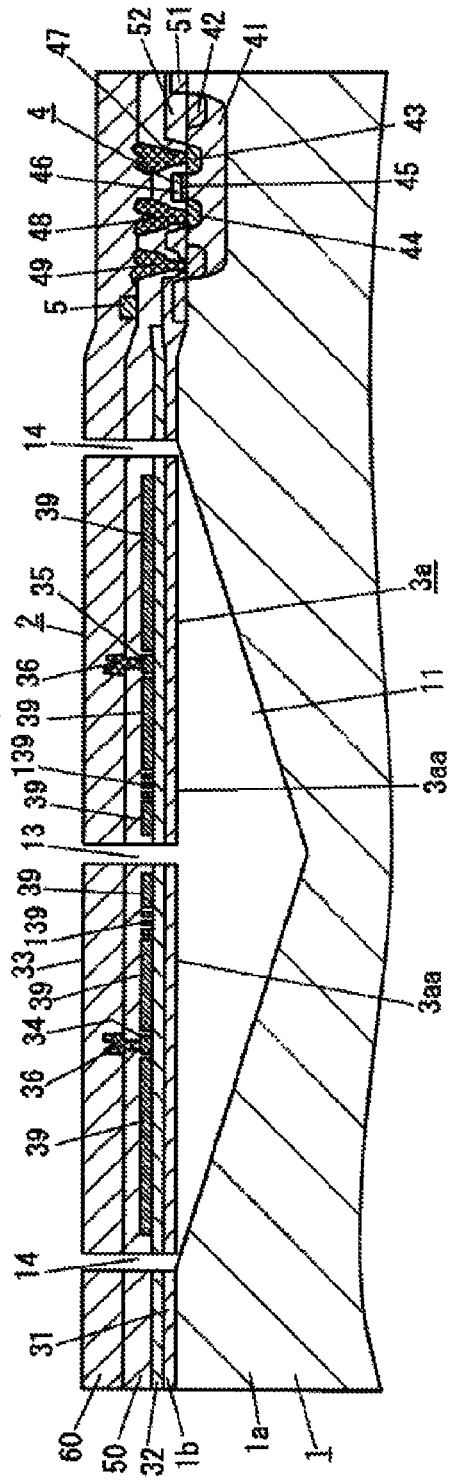

INFRARED ARRAY SENSOR

CROSS REFERENCE TO RELATED APPLICATIONS

This application is related to co-pending application, entitled, "INFRARED ARRAY SENSOR" filed concurrently herewith in the names of Koji Tsuji as a national stage application of International Application No. PCT/JP2010/055803, filed Mar. 31, 2010, which application is assigned to the assignee of the instant application and which co-pending application is also incorporated by reference herein.

TECHNICAL FIELD

The invention relates generally to infrared array sensors and, more particularly, to an infrared array sensor comprising a plurality of pixels.

BACKGROUND ART

There is a conventional infrared array sensor researched and developed in various places, which are formed by using micromachining technologies and includes a base substrate and an array of pixel parts, having an infrared absorption part, located at one surface side of the base substrate (see Japanese Patent Application Publication No. P2001-309122A (hereinafter referred to as a "patent document")).

An infrared image sensor disclosed in the patent document includes a silicon substrate, and pixel forming regions are formed on a surface of the substrate. Sensor elements (e.g., bolometer sensor elements) are also placed on the pixel forming regions, respectively. The patent document also describes that each bolometer sensor element can be replaced with a pyroelectric sensor element or a thermopile sensor element.

Specifically, each of the pixel forming regions is divided into four regions (hereinafter referred to as "segmented regions"), and four sensor elements are placed in the four segmented regions, respectively. Each of the four sensor elements is a membrane structure arranged so as to cover an opening of a depressed portion formed on a surface of the silicon substrate. The structure includes a $SiO_2$ thin film, metallic thin film resistors (resistive bolometers) located on the thin film, a $SiO_2$ thin film (second $SiO_2$ thin film) located on the resistors, and an absorbing film located on the second $SiO_2$ thin film.

Thus, both ends of each sensor element formed in the four segmented regions are extended in a direction along a diagonal line of its own segmented region. The four sensor elements are connected in series by three conductive patterns on a surface of the silicon substrate (end face between depressed portions). Thereby, one pixel output is given by a sum of outputs of four sensor elements, and accordingly each pixel output can be increased. In comparison with a sensor of which each pixel forming region is provided with one sensor element, it is possible to reduce each heat capacity of the four segmented regions and a time constant (a thermal time constant). Therefore, the response speed can be increased.

However, in the infrared image sensor, each of the pixel forming regions is divided into four segmented regions by a cross-shaped slit, and accordingly an area of a membrane structure per pixel is decreased by the slit. It is therefore difficult to increase the sensitivity of the sensor.

If each thickness dimension of the membrane structures is increased, the sensitivity can be increased, but the response speed is reduced because each heat capacity of the membrane structures is increased. Conversely, if each thickness dimension of the membrane structures is decreased, the response speed is increased, but each membrane structure may warp in addition to an increase of the sensitivity, which thereby causes a decrease in yield by breakage in production. The decrease of structure stability may also cause reduction in sensitivity.

Each of the sensor elements formed in the four segmented regions is supported by the silicon substrate through two linear arms extended in a direction along a diagonal line of its own segmented region. Accordingly, each membrane structure may be deformed by external force such as vibration or the like.

SUMMARY OF INVENTION

It is an object of the present invention to improve the structure stability in addition to improvement of the response speed and sensitivity.

An infrared array sensor of the present invention comprises: a base substrate (1) comprising first and second surfaces; cavities (11) which have array structure and are formed on the first surface side of the base substrate (1); and pixel parts (2) which are supported by the base substrate (1) to cover the cavities (11), respectively, each of the pixel parts comprising a membrane structure (3a). Each membrane structure (3a) of the pixel parts (2) comprises segmented membrane structures (3aa) divided by slits (13). Each of the segmented membrane structures (3aa) comprises a thermosensor (30a). Preferably, each membrane structure (3a) of the pixel parts (2) comprises a coupling piece (3c) for coupling its own segmented membrane structures (3aa) to each other.

In this invention, structure stability can be improved and sensitivity stability can be enhanced.

In an embodiment, each membrane structure (3a) of the pixel parts (2) comprises thermosensors (30a) that are electrically connected to each other so that a sum of each absolute value output of the thermosensors (30a) is obtained. In this embodiment, response speed and sensitivity can be improved.

In an embodiment, each thermosensor (30a) of the pixel parts (2) is a thermopile. Thermosensors (30a) of each membrane structure (3a) of the pixel parts (2) are electrically connected in series to each other so that a sum of each absolute value output of the thermosensors (30a) is obtained. In this embodiment, it is unnecessary to apply an electric current to each thermosensor, and accordingly self-heating is not produced. Therefore, it is possible to prevent each segmented membrane structure (3aa) from warping owing to self-heating. The embodiment also has advantages such as electric power saving, and high-precision sensitivity free of the influence of temperature.

In an embodiment, each of said segmented membrane structures (3aa) is supported by the base substrate (1) through a bridge part (3bb). Said bridge part (3bb) and the segmented membrane structure (3aa) supported by the base substrate (1) therethrough are in the shape of a rectangle surrounded by two or three slits (13). Said two or three slits are divided by one or two coupling pieces (3c).

In an embodiment, each inner circumference of the cavities (11) is in the shape of a rectangle. Said segmented membrane structures (3aa) comprise two segmented membrane structures (3aa) arranged so as to approach to each other from both sides of an opening of a corresponding cavity (11). Said two segmented membrane structures (3aa) are coupled to each other by said one or two coupling pieces (3c). In this embodiment, it is possible to reduce warping of each of the two segmented membrane structures (3aa). The sensitivity is stabilized and fabrication yield is improved.

In an embodiment, each inner circumference of the cavities (11) is in the shape of a rectangle. Said segmented membrane structures (3aa) comprise two segmented membrane structures (3aa) laying next to each other along one side of an opening of a corresponding cavity (11). Said two segmented membrane structures (3aa) are coupled to each other by said one coupling piece (3c). In this embodiment, each torsional stiffness of the two segmented membrane structures (3aa) is increased. Thereby, each torsional deformation of the two segmented membrane structures (3aa) can be reduced and the sensitivity is stabilized and fabrication yield is improved.

In an embodiment, chamfer parts (3d) are formed between both side edges of said coupling piece (3c) and a side edge of the segmented membrane structure (3aa), respectively. In this embodiment, it is possible to absorb stress concentration at the coupling region of said coupling piece and said segmented membrane structure in comparison with the case that no chamfer parts are formed. The remaining stress and breakage generated in production can be reduced, and fabrication yield is improved. It is also possible to prevent breakage caused by stress generated by impact or external temperature change in use.

In an embodiment, the coupling piece (3c) comprises a reinforced layer (39b) for reinforcing the coupling piece (3c). In this embodiment, it is also possible to prevent breakage caused by stress generated by impact or external temperature change in use. The breakage in production can be reduced, and fabrication yield is improved.

In an embodiment, each of the cavities (11) is in the shape of a four-sided pyramid. In this embodiment, when a silicon substrate is used as the base substrate (1), each cavity 11 can be easily formed by anisotropic etching using alkaline solution.

In an embodiment, each of the cavities (11) comprises an opening at the second surface side of the base substrate (1). In this embodiment, it is possible to suppress heat transfer from each membrane structure to the base substrate, and sensitivity is more increased.

In an embodiment, the base substrate (1) comprises an opening (12) including the cavities (11) at the second surface side of the base substrate (1). In this embodiment, it is possible to more suppress heat transfer from each membrane structure to the base substrate, and sensitivity is more increased.

In an embodiment, each inner face of the cavities (11) is a concave curve. In this embodiment, it is possible to reflect infrared rays penetrating a membrane structure into the membrane structure by the inner face of a cavity. Absorbed amount of infrared rays can be increased and sensitivity is improved.

An infrared array sensor of the present invention comprises: a base substrate (1); cavities (11) which have array structure and are formed on a surface side of the base substrate (1); and pixel parts (2) which are supported by the base substrate (1) to cover the cavities (11), respectively, each of the pixel parts comprising a membrane structure (3a). Each membrane structure (3a) of the pixel parts (2) comprises segmented membrane structures (3aa) divided by slits (13). Each of the segmented membrane structures (3aa) comprises thermosensors (30a). The thermosensors (30a) are electrically connected to each other so that a sum of each absolute value output of the thermosensors (30a) is obtained. Preferably, the thermosensors (30a) is a thermopile each, and are electrically connected in series to each other so that a sum of each absolute value output of the thermosensors (30a) is obtained. In this embodiment, the response speed and sensitivity can be further improved. The embodiment may comprise a coupling piece (3c).

An infrared array sensor of the present invention comprises: a base substrate (1); cavities (11) which have array structure and are formed on a surface side of the base substrate (1); and pixel parts (2) which are supported by the base substrate (1) to cover the cavities (11), respectively, each of the pixel parts comprising a membrane structure (3a). Each membrane structure (3a) of the pixel parts (2) comprises segmented membrane structures (3aa) divided by slits (13). Each of the segmented membrane structures (3aa) comprises a thermosensor (30a). Each of said segmented membrane structures (3aa) is supported by the base substrate (1) through a bridge part (3bb). Said bridge part (3bb) and the segmented membrane structure (3aa) supported by the base substrate (1) therethrough comprises a thermosensor (30a) comprised of first and second thermosensor halves which are electrically connected to each other at a connecting point as a hot junction. The hot junction is placed in the segmented membrane structure (3aa), while both ends of the thermosensor (30a) is placed at the base substrate side. In addition, the hot junctions in the segmented membrane structures (3aa) are placed at the central part of the segmented membrane structures (3aa). In this embodiment, each temperature change in hot junctions can be increased, and accordingly the sensitivity can be improved. The embodiment may comprise a coupling piece (3c).

BRIEF DESCRIPTION OF DRAWINGS

Preferred embodiments of the invention will now be described in further details. Other features and advantages of the present invention will become better understood with regard to the following detailed description and accompanying drawings where:

FIGS. 4A and 4B show an essential part of the pixel part in the infrared array sensor, and are a plane layout chart and a schematic cross sectional view along line D-D' of FIG. 4A, respectively;

FIGS. 7A and 7B show an essential part of the pixel part in the infrared array sensor, and are a plane layout chart and a schematic cross sectional view along line D-D' of FIG. 7A, respectively;

FIG. 15 is, as an explanatory diagram of a method for manufacturing the infrared array sensor, its cross sectional view in a principal process;

FIG. 16 is a cross sectional view in a principal process, as an explanatory diagram, of a method for manufacturing the infrared array sensor;

FIG. 17 is a cross sectional view in a principal process, as an explanatory diagram, of a method for manufacturing the infrared array sensor;

FIG. 18 is a cross sectional view in a principal process, as an explanatory diagram, of a method for manufacturing the infrared array sensor;

DESCRIPTION OF EMBODIMENTS

Embodiment 1

An infrared array sensor A of the embodiment is explained with reference to FIGS. 1-13.

Figure 13:
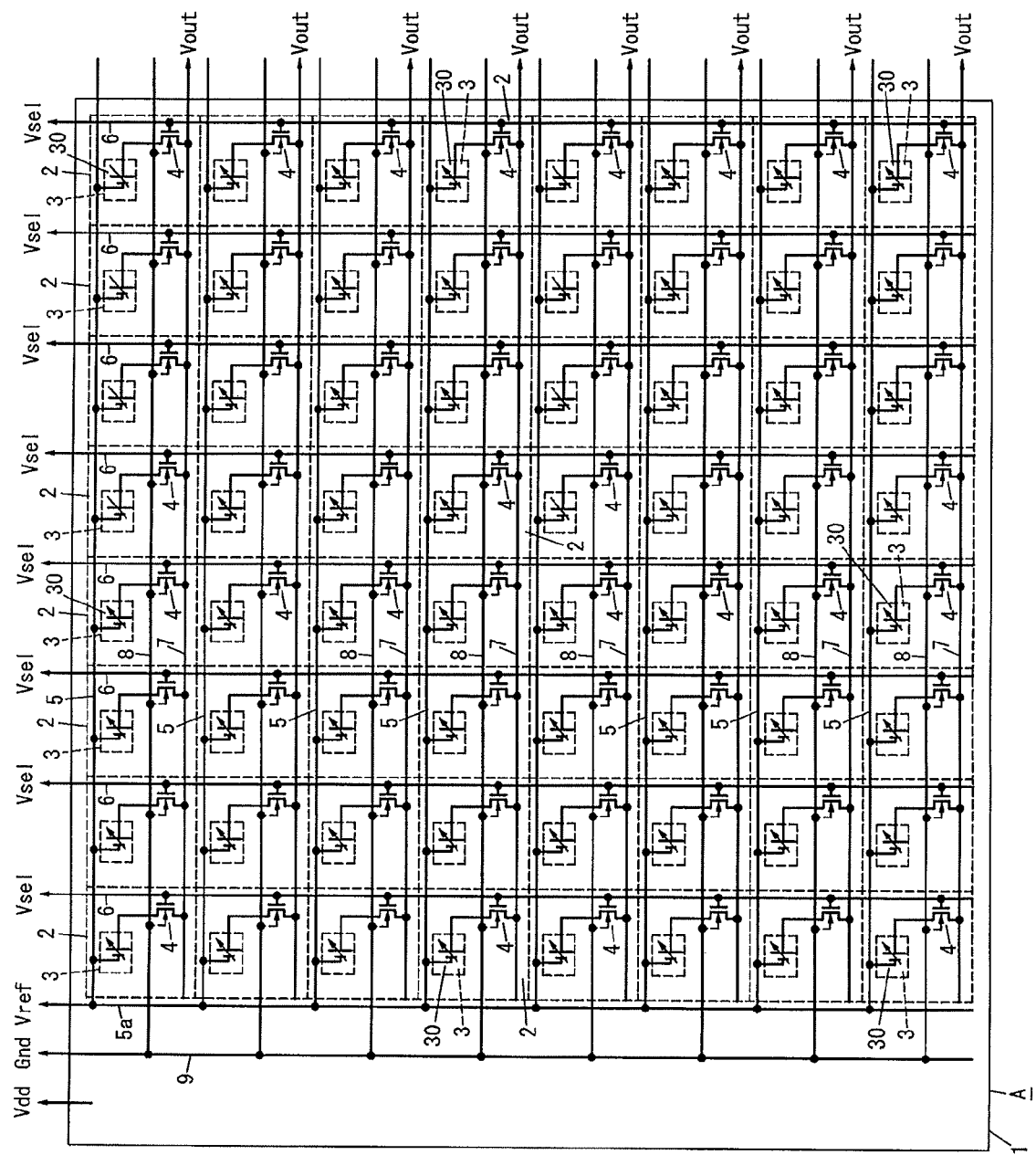
FIG. 13 is an equivalent circuit schematic of the infrared array sensor.

The infrared array sensor A of the embodiment includes a base substrate 1 having a first surface (a front surface) and a second surface (a back surface). The base substrate 1 is provided at the first surface side with an array (in this instance, two-dimensional array) of pixel parts 2 (see FIG. 3) each of which has a thermal-type infrared sensing part 3 and a MOS transistor 4 that is an pixel selecting switching element. The base substrate 1 is formed of a silicon substrate 1a. In the embodiment, m×n (in the example of FIGS. 3 and 13, but not limited to, 8×8) pixel parts 2 are formed on the first surface side of one base substrate 1. In the embodiment, a temperature sensor 30 of the thermal-type infrared sensing part 3 is formed of a plurality of (e.g., six) thermosensors 30a (see FIG. 1) each of which is formed of a thermopile and which are connected in series so that a sum of each absolute value output of the thermosensors 30a is obtained. In FIG. 13, an equivalent circuit of a temperature sensor 30 in the thermal-type infrared sensing part 3 is represented by a voltage source Vs corresponding to thermal electromotive force of the temperature sensor 30.

Figure 1:
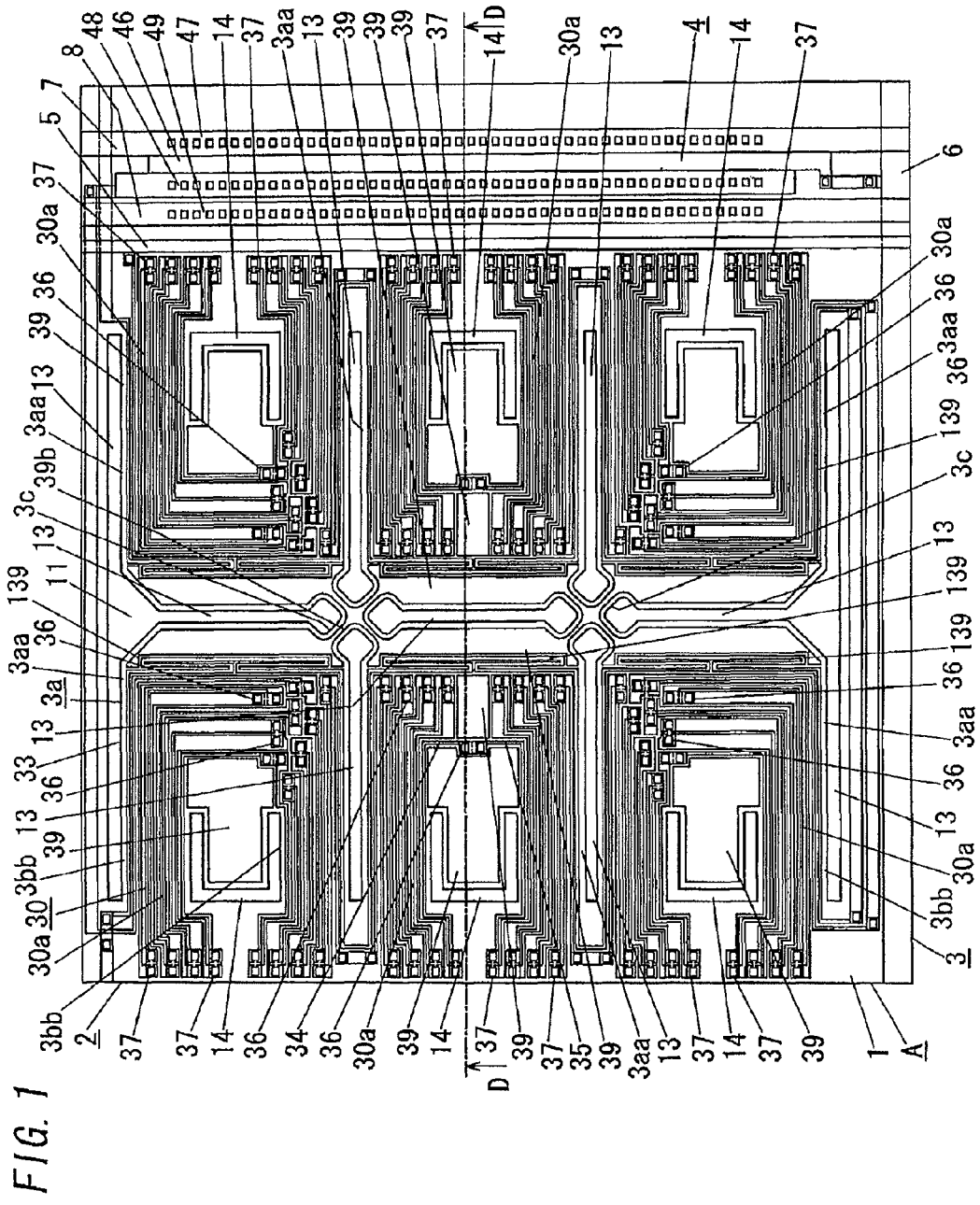
FIG. 1 is a plane layout chart of a pixel part in an infrared array sensor of an embodiment 1.
Figure 2:
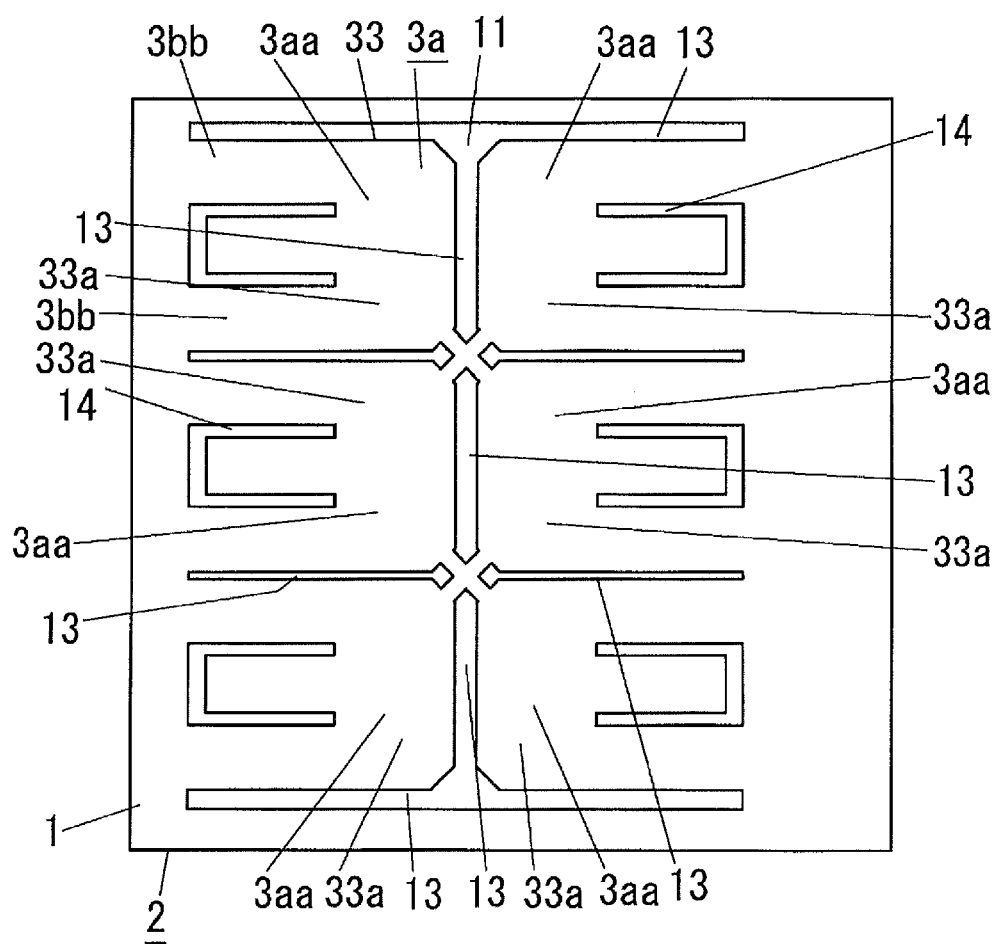
FIG. 2 is a plane layout chart of the pixel part in the infrared array sensor.
Figure 3:
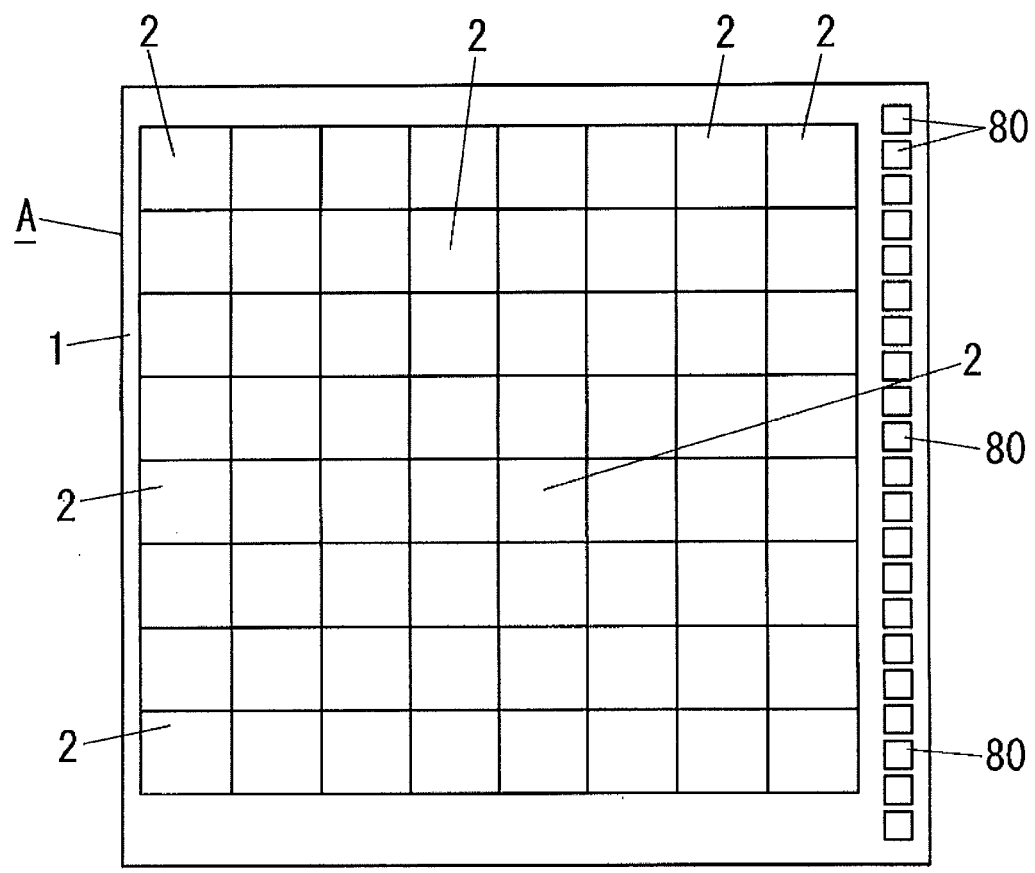
FIG. 3 is a plane layout chart of the infrared array sensor.

As shown in FIGS. 1, 4 and 13, the infrared array sensor A of the embodiment includes vertical read lines 7, horizontal signal lines 6, ground lines 8, a common ground line 9 and reference bias lines 5. Each of the vertical read lines 7 is commonly connected with first ends of a column of temperature sensors 30 in the thermal-type infrared sensing parts 3 through a column of MOS transistors 4. Each of the horizontal signal lines 6 is commonly connected with gate electrodes 46 of MOS transistors 4 corresponding to a row of temperature sensors 30 in the thermal-type infrared sensing parts 3. Each of the ground lines 8 is commonly connected with p$^+$ well regions 41 of a column of MOS transistors 4. The common ground line 9 is commonly connected with the ground lines 8. Each of the reference bias lines 5 is commonly connected with second ends of a column of temperature sensors 30 in the thermal-type infrared sensing parts 3. The sensor is adapted to provide, as time-series data, outputs of all the temperature sensors 30 in the thermal-type infrared sensing parts 3. In short, the infrared array sensor A of the embodiment is formed with pixel parts 2 having, at the first surface side of the base substrate 1, thermal-type infrared sensing parts 3 and MOS transistors 4 which are laid side by side with the infrared sensing parts 3 and adapted to read out the outputs of the infrared sensing parts 3.

In this instance, the gate electrode 46 of a MOS transistor 4 is connected to a horizontal signal line 6, and its source electrode 48 is connected to a reference bias line 5 through a temperature sensor 30, and its drain electrode 47 is connected to a vertical read line 7. Each reference bias line 5 is commonly connected to a common reference bias line 5a. The horizontal signal lines 6 are electrically connected to discrete pixel selecting pads Vsel, respectively. The vertical read lines 7 are electrically connected to discrete output pads Vout, respectively. The common ground line 9 is electrically connected to a ground pad Gnd. The common reference bias line 5a is electrically connected to a reference bias pad Vref. The silicon substrate 1a is electrically connected to a substrate pad Vdd.

Therefore, it is possible to sequentially read out each output voltage of the pixel parts 2 by controlling each electric potential of the pixel selecting pads Vsel so that the MOS transistors 4 are turned on sequentially. For example, when electric potential of the reference bias pad Vref, electric potential of the ground pad Gnd and electric potential of the substrate pad Vdd are set to 1.65, 0V and 5V, respectively, if electric potential of a pixel selecting pad Vsel is set to 5V, MOS transistors 4 are turned on and each output voltage of pixel parts 2 (1.65V+"output voltage of temperature sensor 30") is read out from the output pads Vout. If electric potential of a pixel selecting pad Vsel is set to 0V, MOS transistors 4 are turned off and no output voltage of pixel parts 2 is read out from the output pads Vout. Incidentally, in FIG. 3, all of the pixel selecting pads Vsel, the reference bias pad Vref, the ground pad Gnd, the output pads Vout and the like are depicted by 80 with no distinction.

Figure 14:
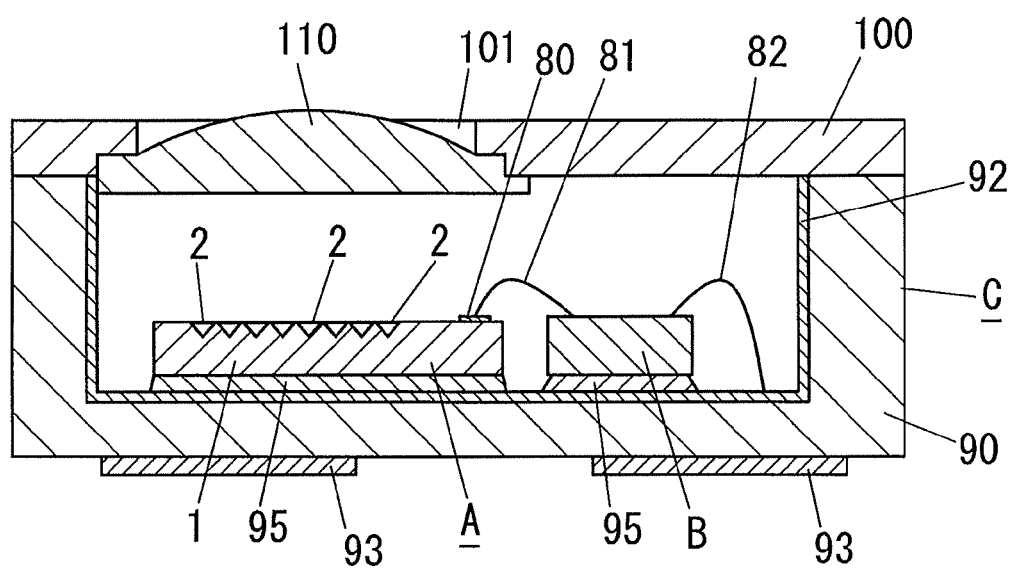
FIG. 14 is a schematic cross sectional view of an infrared module having the infrared array sensor.

As shown in FIG. 14, an infrared array sensor module may include an infrared array sensor A, a signal processing IC chip B configured to perform the signal processing of output voltages as output signals of the infrared array sensor A, and a package C in which the infrared array sensor A and the signal processing IC chip B are put. In this instance, a thermal imaging can be obtained if the signal processing IC chip B is provided with: pads (not shown) which are electrically connected to the pads 80 of the infrared array sensor A through wires 81 formed of bonding wires, respectively; an amplifier circuit configured to amplify each output voltage of pads (hereinafter referred to as "input pads") of the pads, connected to the output pads Vout of the infrared array sensor A; and a multiplexer configured to alternatively supply output voltages of the input pads to the amplifier circuit.

The package C is composed of a package body 90 and a package lid 100. The package body 90 is formed of a multi-layer ceramic substrate (a ceramic package) which is in the shape of a rectangular case having an opening at its one face, and the infrared array sensor A and the signal processing IC chip B are mounted on its inner bottom face. The package lid 100 is a metal lid which is attached to the one face side of the package body 90, and includes a lens 110 configured to focus infrared rays on the infrared array sensor A. A airtight space enclosed by the package body 90 and the package lid 100 is a dry nitrogen atmosphere. In this example, the periphery of the package lid 100 is fixed, by seam welding, to a rectangular frame shaped metal pattern (not shown) formed on the one face of the package body 90. The package body 90 is not limited to the multilayer ceramic substrate. For example, the body may be formed of laminated glass epoxy resin substrates.

In this instance, a shield conductive pattern 92 is formed over the inner face of the package body 90. The infrared array sensor A and the signal processing IC chip are joined to the shield conductive pattern 92 of the package body 90 through joining layers 95, 95 formed of conductive junction material (e.g., solder, silver paste or the like). The joining method of the infrared array sensor A and the signal processing IC chip B to the package body 90 is not limited to the method using the conductive junction material such as solder or silver paste. For example, a room-temperature bonding method, a joining method using, e.g., Au—Sn eutectic or Au—Si eutectic may be employed. In this regard, a joining method capable of direct joining such as a room-temperature bonding method is of advantage to improvement of distance accuracy between the infrared array sensor A and the lens 110 in comparison with a joining method using conductive junction material.

The material of the lens 110 in the instance is Si as a kind of infrared-transparent material, and may be formed by a LIGA process, a method for manufacturing a semiconductor lens based on anodic oxidation technology (e.g., Japanese Patent Nos. 3897055, 3897056), or the like. The lens 110 is adhered, by electrically conductive adhesive (e.g., solder, silver paste or the like), to the periphery of an open window 101 of the package lid 100 so that the open window 101 is shut. The lens 110 is also electrically connected to the shield conductive pattern 92 of the package body 90. Therefore, in the infrared array sensor module, it is possible to prevent the decrease of an S/N ratio caused by exogenous electromagnetic noise. Incidentally, the lens 110 may be provided with a necessary, appropriate infrared optical filter (a band-pass filter, a broadband cutoff filter, etc.) formed by alternately laminating films different in refractive index.

In the infrared array sensor module, the base substrate 1 of the infrared array sensor A has a peripheral shape of a rectangle. All of the pads 80 in the infrared array sensor A are arranged side by side along a side of peripheral edges of the base substrate 1. The signal processing IC chip B has a peripheral shape of a rectangle. The signal processing IC chip B is provided, along a side of its peripheral edges, with the aforementioned pads which are electrically connected to the pads 80 of the infrared array sensor A, respectively. The infrared array sensor A and the signal processing IC chip B are arranged so that the aforementioned their sides become nearer to each other than their other sides. Accordingly, it is possible to shorten the wires 81 connecting between the pads 80 of the infrared array sensor A and the pads of the signal processing IC chip B. Therefore, exogenous noise can be reduced and the noise resistance is improved.

Each configuration of the thermal-type infrared sensing part 3 and the MOS transistor 4 is now explained. In the present embodiment, a single-crystal silicon substrate of which conduction type and first surface are n-type and (100) surface, respectively is employed as the silicon substrate 1a.

In each pixel part 2 on the first surface side of the silicon substrate 1a, a thermal-type infrared sensing part 3 is formed in the forming regions A1 of a thermal-type infrared sensing part 3. In each pixel part 2 on the first surface side of the silicon substrate 1a, a MOS transistor 4 is formed in the forming region A2 of a MOS transistor 4.

By the way, each pixel part 2 includes: an infrared absorption part 33 for absorbing infrared rays; a cavity 11 which is formed in the base substrate 1 and thermally insulates the infrared absorption part 33 from the base substrate 1; and a membrane structure (a thin film structure) 3a which covers the cavity 11 and has the infrared absorption part 33 within the cavity 11 in plane view from the first surface side of the base substrate 1. Each membrane structure 3a in the pixel parts 2 is divided, by linear slits 13, into a plurality of (in the example of FIG. 1, six) segmented membrane structures (small tin film structures) 3aa which are arranged side by side along a circumferential direction of the cavity and extended inwards from the periphery of the cavity 11 in the base substrate 1. Each of the segmented membrane structures 3aa is provided with a thermosensor 30a, and all of the thermosensors 30a are electrically connected at a relation of connection that an output change in response to temperature change becomes larger than that of the case where each output is separately obtained from each thermosensor 30a. Each pixel part 2 is formed with a coupling piece 3c for coupling adjoining segmented membrane structures 3aa, 3aa. Hereinafter, each of parts, of each infrared absorption part 33, corresponding to segmented membrane structures 3aa, respectively is referred to as a segmented infrared absorption part 33a.

Incidentally, all of thermosensors 30a formed on a membrane structure 3a, in the example above, all of six thermosensors 30a may not always be connected in series. For example, a series circuit of three thermosensors 30a and another series circuit of three thermosensors 30a may be connected in parallel. In this instance, the sensitivity can be increased in comparison with the case that all of the six thermosensors 30a are connected in parallel or each output is separately obtained from each thermosensor 30a. In addition, in comparison with the case that all of six thermosensors 30a are connected in series, the electric resistance of a temperature sensor 30 can be decreased and its thermal noise is decreased, and accordingly the S/N ratio is improved.

In this instance, each segmented membrane structure 3aa in a pixel part 2 is formed with two bridge parts 3bb, 3bb in the shape of a rectangle in plane view, which are formed and spaced in a circumferential direction of the cavity 11 and couple the base substrate 1 and the segmented infrared absorption part 33a. Each segmented membrane structure 3aa is formed with a slit 14 in the shape of a horseshoe in plane view, which spatially separates the two bridge parts 3bb, 3bb and the segmented infrared absorption part 33a and communicates with the cavity 11. In this instance, a part of the base substrate 1, surrounding the membrane structure 3a in plane view is in the shape of a rectangular frame. A part, except for parts connected with the infrared absorption part 33 and the base substrate 1, of a bridge part 33b is spatially separated from the segmented infrared absorption part 33a and the base substrate 1 by slits 13 and 14. In this instance, the dimension in an extended direction of a segmented membrane structure 3aa from the base substrate 1 is set to 93 µm, the dimension in a width direction perpendicular to the extended direction of the segmented membrane structure 3aa is set to 75 µm, a width dimension of each bridge part 33b is set to 23 µm, and each width of slits 13 and 14 is set to 5 µm. These values are one example and not limited to in particular.

The membrane structure 3a is formed by patterning a laminated structure including: a silicon dioxide film 1b formed on the first surface side of the silicon substrate 1a; a silicon nitride film 32 formed on the silicon dioxide film 1b; a temperature sensor 30 formed on the silicon nitride film 32; an interlayer dielectric film 50 formed of a BPSG film covering the temperature sensor 30 at the surface side of the silicon nitride film 32; and a passivation film 60 formed of laminated films of a PSG film formed on the interlayer dielectric film 50 and an NSG film formed on the PSG film.

In the embodiment, the aforementioned infrared absorption part 33 is formed of a part of the silicon nitride film 32, except for the bridge parts 3bb, 3bb of the membrane structure 3a. The base substrate 1 is composed of the silicon substrate 1a, the silicon dioxide film 1b, the silicon nitride film 32, the interlayer dielectric film 50 and the passivation film 60. In the embodiment, laminated films of the interlayer dielectric film 50 and the passivation film 60 are formed astride a forming region A1 of the thermal-type infrared sensing part 3 and a forming region A2 of the MOS transistor 4, and a part formed at the forming region A1 of the thermal-type infrared sensing part 3 also functions as the infrared absorbing film 70 (see FIG. 4B). In this instance, when a refractive index of the infrared absorbing film 70 and a central wavelength of infrared rays from a detection object are $n_2$ and $\lambda$, respectively, a thickness of the infrared absorbing film 70 (t2) is set to $\lambda/4n_2$. Accordingly, it is possible to increase absorption efficiency of infrared rays of a wavelength (e.g., 8-12 μm) from the detection object, and the sensitivity is increased. For example, in the case of $n_2$=1.4 and $\lambda$=10 μm, it just needs to set t2≈1.8 μm. Incidentally, in the embodiment, a thickness of the interlayer dielectric film 50 is 0.8 μm and a thickness of the passivation film 60 is 1 μm (a thickness of the PSG film is 0.5 μm and a thickness of the NSG film is 0.5 μm). The infrared absorbing film 70 is not limited to the aforementioned structure. For example, the film may be formed of a silicon nitride film.

Each thermosensor 30a in the pixel parts 2 is also a thermopile and the aforementioned relation of connection is a serial connection. In each pixel part 2, each inner circumference of the cavities 11 is in the shape of a rectangle. Each coupling piece 3c is in the shape of a cross in plane view, and couples: segmented membrane structures 3aa, 3aa adjoined in a diagonal direction intersecting with an extension direction of the segmented membrane structures 3aa; segmented membrane structures 3aa, 3aa adjoined in an extension direction of the segmented membrane structures 3aa; and segmented membrane structures 3aa, 3aa adjoined in an orthogonal direction to an extension direction of the segmented membrane structures 3aa.

A thermosensor 30a formed of a thermopile has a plurality of (in the example of FIG. 1, nine) thermocouples each of which electrically connects between a first end of n-type polysilicon layer 34 (one of first and second thermosensor halves) and a first end of p-type polysilicon layer 35 (the other of first and second thermosensor halves) by a connection part (hot junction) 36 formed of metal material (e.g., Al—Si, etc.) at the side of infrared entrance of the segmented infrared absorption part 33a, wherein the n-type polysilicon layer 34 and the p-type polysilicon layer 35 are formed on the silicon nitride film 32 and formed astride the segmented membrane structure 3aa and the base substrate 1. Second ends (output terminals as cold junctions) of n-type polysilicon layer 34 and p-type polysilicon layer 35, as a thermocouple, adjoined at the first surface side of the base substrate 1 are joined and electrically connected by a connection part 37 formed of metal material (e.g., Al—Si, etc.). In the thermopile forming the thermosensor 30a in this instance, the first ends of the n-type polysilicon layer 34 and the p-type polysilicon layer 35 and a connection part 36 constitute a hot junction at the side of a segmented infrared absorption part 33a, while the second ends of the n-type polysilicon layer 34 and the p-type polysilicon layer 35 and a connection part 37 constitute a cold junction at the side of the base substrate 1.

Figure 5:
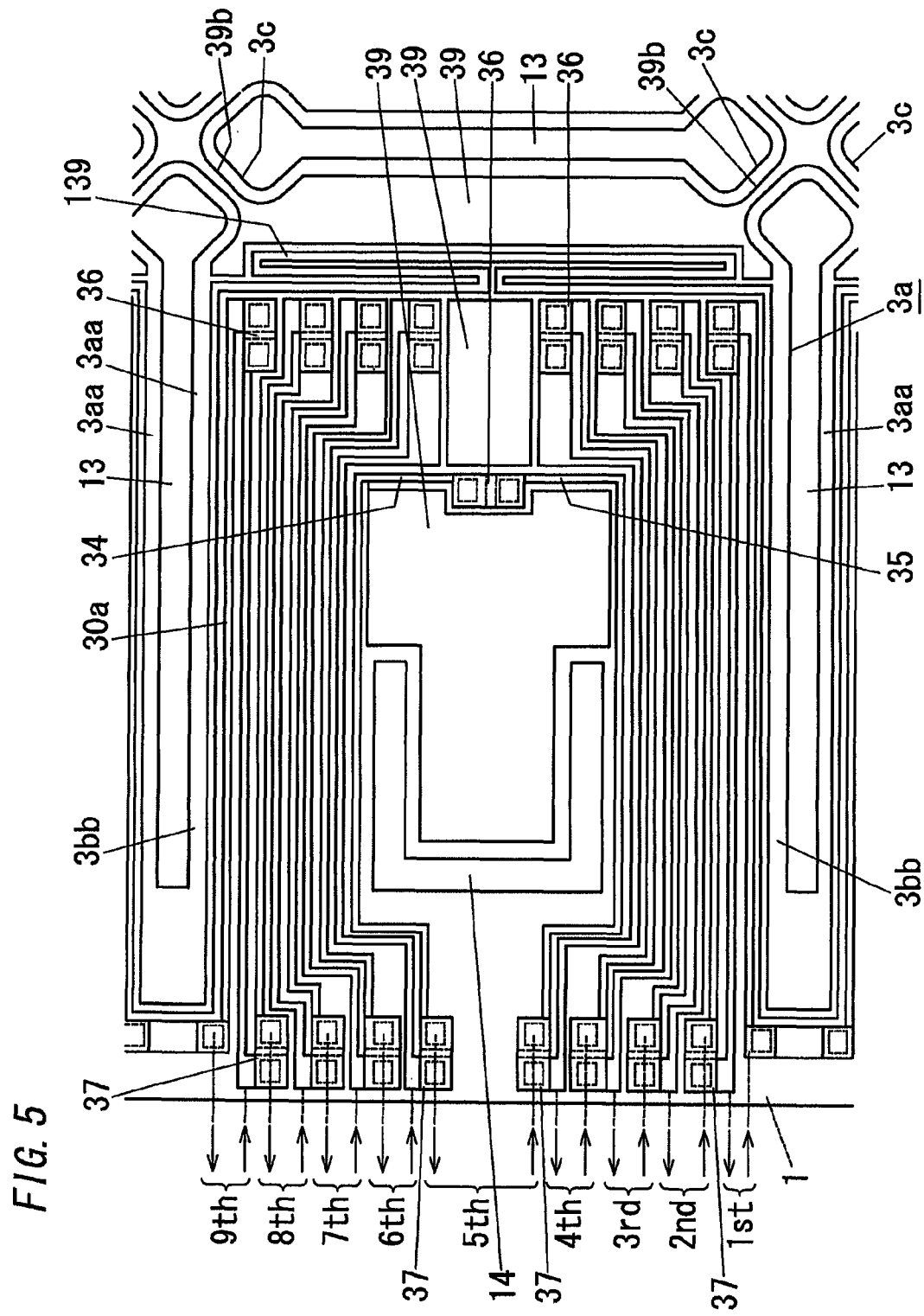
FIG. 5 is a plane layout chart of an essential part of the pixel part in the infrared array.
Figure 6:
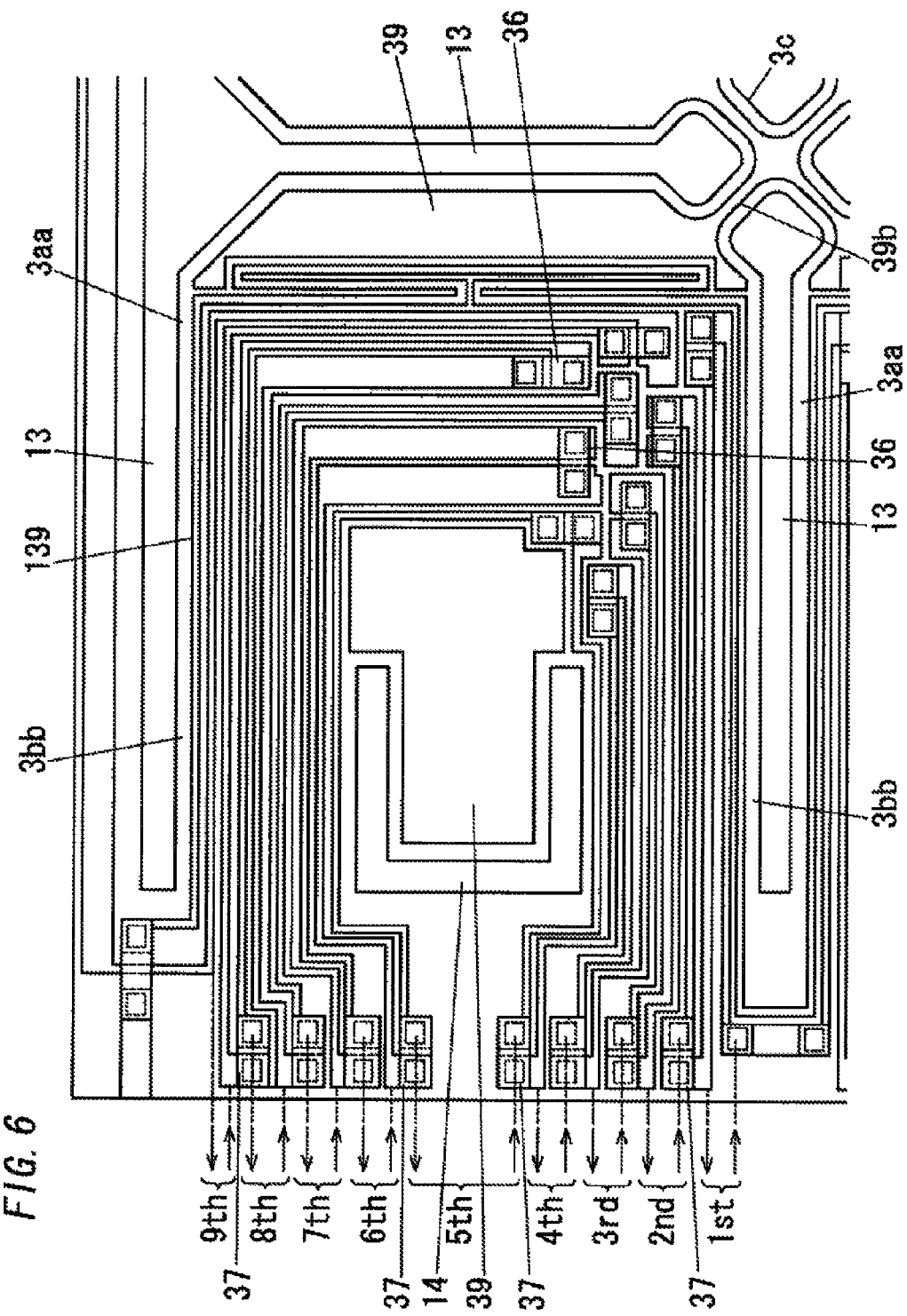
FIG. 6 is a plane layout chart of an essential part of the pixel part in the infrared array.

In short, as shown in FIGS. 5 and 6, each of the segmented membrane structure (3aa) includes a plurality of (first to ninth) thermosensors (30a) that constitute a combinational circuit and are electrically connected to each other so that a sum of each absolute value output of the thermosensors (30a) is obtained. For example, the thermosensors (thermopiles) constitute a series circuit and are connected in series to each other so that a sum of each absolute value output of the thermosensors (30a) is obtained. In addition, a plurality of (six) combinational circuits in a plurality of (six) membrane structures 3a are electrically connected to each other so that a sum of each absolute value output of the combinational circuits is obtained. For example, the series circuits are connected in series to each other so that a sum of each absolute value output of the series circuits is obtained.

In the infrared array sensor A of the embodiment, the aforementioned cavity 11 is in the shape of a four-sided pyramid and has a depth deeper at its central part than its circumference in plane view. Accordingly, a planar layout of the thermosensors 30a in each pixel part 2 is designed so that the hot junctions are gathered at the central part of the membrane structure 3a. That is, in two segmented membrane structures 3aa at the middle of a vertical direction of FIG. 1, the connection parts 36 are arranged side by side along an arrangement direction of three segmented membrane structures 3aa as shown in FIGS. 1 and 5. In two segmented membrane structures 3aa at the upper side of the vertical direction, the connection parts 36 are arranged and gathered at a place near to the segmented membrane structures 3aa at the middle of the arrangement direction of three segmented membrane structures 3aa as shown in FIGS. 1 and 6. In two segmented membrane structures 3aa at the lower side of the vertical direction, the connection parts 36 are arranged and gathered at a place near to the segmented membrane structures 3aa at the middle of the arrangement direction of three segmented membrane structures 3aa as shown in FIG. 1. Therefore, in the infrared array sensor A of the embodiment, it is possible to increase temperature change in each hot junction to improve sensitivity in comparison with the case that the arrangement of the connection parts 36 of the segmented membrane structures 3aa at the upper and lower sides of the vertical direction of FIG. 1 is the same as that of the connection parts 36 of the segmented membrane structures 3aa at the middle.

In a segmented membrane structure 3aa, an infrared absorption layer 39 (see FIGS. 1, 4 and 10) is formed at a region at the side of infrared entrance of the silicon nitride film 32 where no thermosensor 30a is formed. The infrared absorption layer is formed of an n-type polysilicon layer, and absorbs infrared rays and prevents warping of the segmented membrane structure 3aa. A coupling piece 3C coupling adjoining segmented membrane structures 3aa, 3aa is provided with a reinforced layer 39b (see FIG. 7) which is formed of an n-type polysilicon layer and reinforces the coupling piece 3C. In this instance, the reinforced layer 39b and the infrared absorption layer 39 have a continuous integrated structure. Thus, in the infrared array sensor A of the embodiment, the coupling piece 3C is reinforced by the reinforced layer 39b, and accordingly it is possible to prevent breakage caused by stress generated by impact or external temperature change in use, and also to decrease breakage in production to improve fabrication yield. In the embodiment, as shown in FIG. 7, a length dimension L1 and a width dimension L2 of the coupling piece 3c and a width dimension L3 of the reinforced layer 39b are set to, but are not limited to, for example, 24 μm and 5 μm and 1 μm, respectively. When the base substrate 1 and each reinforced layer 39b are formed of the silicon substrate 1a and an n-type polysilicon layer, respectively as the aforementioned embodiment, it is necessary to make the width dimension of the reinforced layer 39b smaller than that of the coupling piece 3c and to locate both side edges of the reinforced layer 39b within both side edges of the coupling piece 3c in plane view in order to prevent etching of the reinforced layer 39b while the cavity 11 is formed.

Figure 12A:
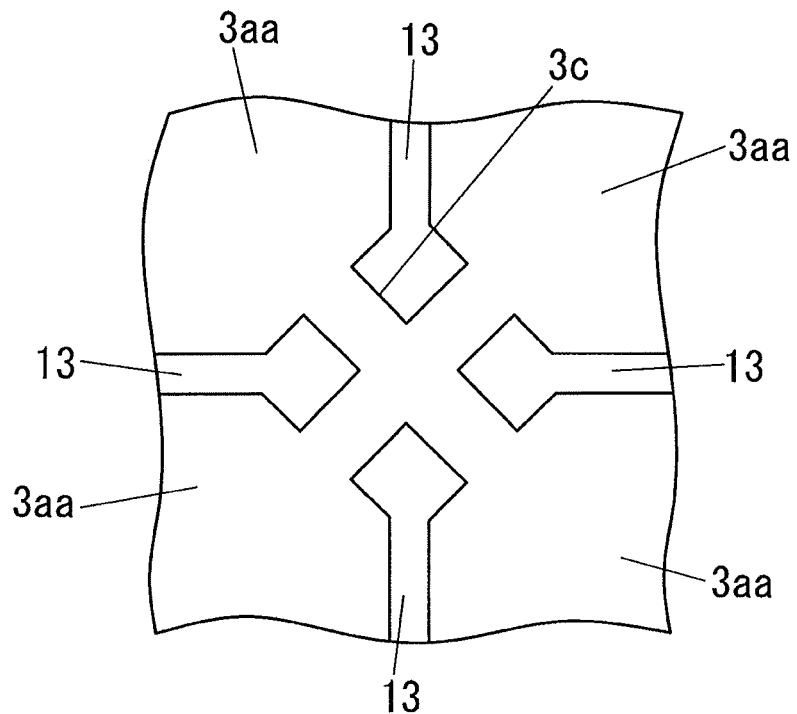
FIG. 12 is an explanatory diagram of an essential part of the infrared array sensor.
Figure 12B:
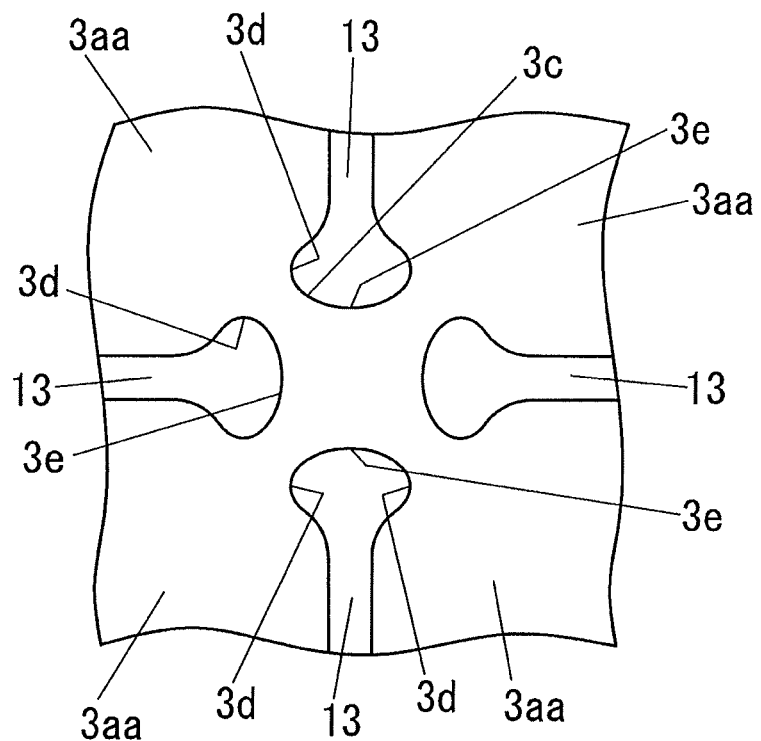

In the infrared array sensor A of the embodiment, as shown in FIGS. 7 and 12B, chamfer parts 3d, 3d are formed between both side edges of the coupling piece 3c and a side edge of the segmented membrane structure 3aa, respectively. A chamfer part 3e is also formed between orthogonal side edges of the cross-shaped coupling piece 3c. Therefore, in the infrared array sensor A of the embodiment, it is possible to reduce stress concentration at a connecting region of a coupling piece 3c and a segmented membrane structure 3aa in comparison with the case that no chamfer parts are formed as shown in FIG. 12A. Thereby, it is possible to reduce remaining stress and breakage generated in production to improve fabrication yield. It is also possible to prevent breakage caused by stress generated by impact or external temperature change in use. In the example shown in FIG. 7, each chamfer part 3d, 3e is R-chamfering of 3 μm but is not limited to the R-chamfering. For example, each of them may be C-chamfering.

In the infrared array sensor A of the embodiment, each pixel part 2 is provided with a fault diagnosis wiring 139 formed of an n-type polysilicon layer drawn astride the base substrate 1 and one bridge part 3bb and a segmented membrane structure 33a and another bridge part 3bb. All of the fault diagnosis wirings 139 are connected in series. Therefore, by energizing a series circuit of m×n fault diagnosis wirings 139, it is possible to detect the presence of breakage such as a broken bridge 3bb.

The infrared absorption layer 39, the reinforced layer 39b and the fault diagnosis wirings 139 contain the same n-type impurities (e.g., phosphorus) as the n-type polysilicon layer 34 at the same impurity concentration (e.g., $10^{18}$-$10^{20}$ cm$^{-3}$), and are formed at the same time as the n-type polysilicon layer 34. It just needs to employ, for example, boron as p-type impurities of the p-type polysilicon layer 35 and to set its impurity concentration in an appropriate range of, for example, $10^{18}$-$10^{20}$ cm$^{-3}$. In the embodiment, each impurity concentration of the n-type polysilicon layer 34 and the p-type polysilicon layer 35 is $10^{18}$-$10^{20}$ cm$^{-3}$, and each resistance value of the thermocouples can be reduced and the S/N ratio can be improved. In this instance, the infrared absorption layer 39, the reinforced layer 39b and the fault diagnosis wirings 139 are doped with the same n-type impurities as the n-type polysilicon layer 34 at the same impurity concentration, but they are not limited to the impurities. For example, they may be doped with the same impurities as the p-type polysilicon layer 35 at the same impurity concentration.

In the embodiment, each thickness t1 of the n-type polysilicon layer 34, the p-type polysilicon layer 35, the infrared absorption layer 39, the reinforced layer 39b and the fault diagnosis wirings 139 is set to $\lambda/4n_1$, where each refractive index of the n-type polysilicon layer 34, the p-type polysilicon layer 35, the infrared absorption layer 39, the reinforced layer 39b and the fault diagnosis wirings 139 is $n_1$, and a central wavelength of infrared rays from a detection object is λ. Accordingly, an absorption efficiency of infrared rays of a wavelength (e.g., 8-12 μm) from the detection object can be increased, and the sensitivity can be increased. For example, in the case of $n_1$=3.6, λ=10 μm, it just needs to set t1≈0.69 μm.

In the embodiment, each impurity concentration of the n-type polysilicon layer 34, the p-type polysilicon layer 35, the infrared absorption layer 39, the reinforced layer 39b and the fault diagnosis wirings 139 is $10^{18}$-$10^{20}$ cm$^{-3}$. Accordingly, it is possible to increase the reflection of infrared rays while increasing the absorbed fraction of infrared rays, and to increase an S/N ratio of each output of the temperature sensors 30. It is also possible to form the infrared absorption layer 39, the reinforced layer 39b and the fault diagnosis wirings 139 at the same process as the n-type polysilicon layer 34, and accordingly the cost can be decreased.

Figure 8A:
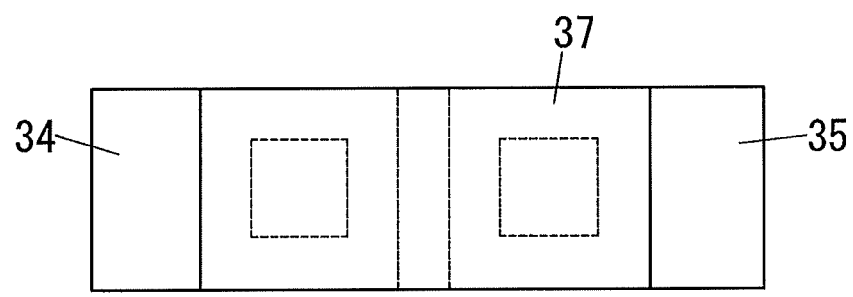
FIGS. 8A and 8B show an essential part of the pixel part in the infrared array sensor, and are a plane layout chart and a schematic cross sectional view, respectively.
Figure 8B:
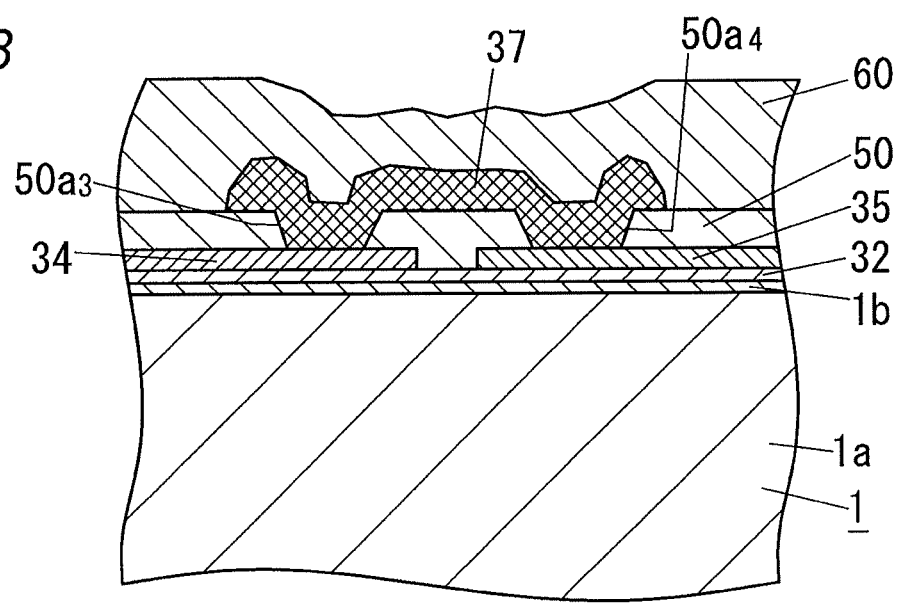
Figure 9A:
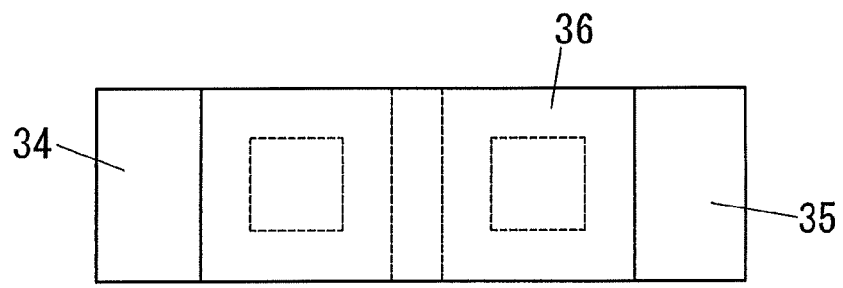
FIGS. 9A and 9B show an essential part of the pixel part in the infrared array sensor, and are a plane layout chart and a schematic cross sectional view, respectively.
Figure 9B:
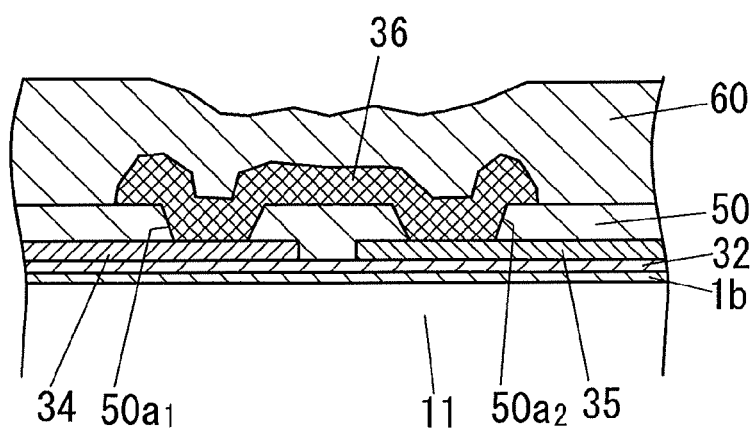
Figure 10:
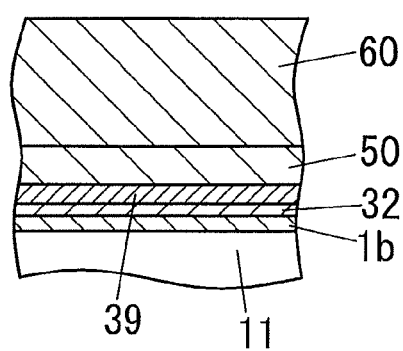
FIG. 10 is a schematic cross sectional view of an essential part of the pixel part in the infrared array sensor.

In this instance, the connection part 36 and the connection part 37 in the temperature sensor 30 are separated and insulated by the interlayer dielectric film 50 at the first surface side of the base substrate 1 (see FIGS. 8 and 9). That is, the hot junction 36 is electrically connected to each first end of the polysilicon layers 34, 35 through contact holes $50a_1$, $50a_2$ formed in the interlayer dielectric film 50. The connection part 37 at the cold junction side is electrically connected to each second end of the polysilicon layers 34, 35 through contact holes $50a_3$, $50a_4$ formed in the interlayer dielectric film 50.

Figure 11:
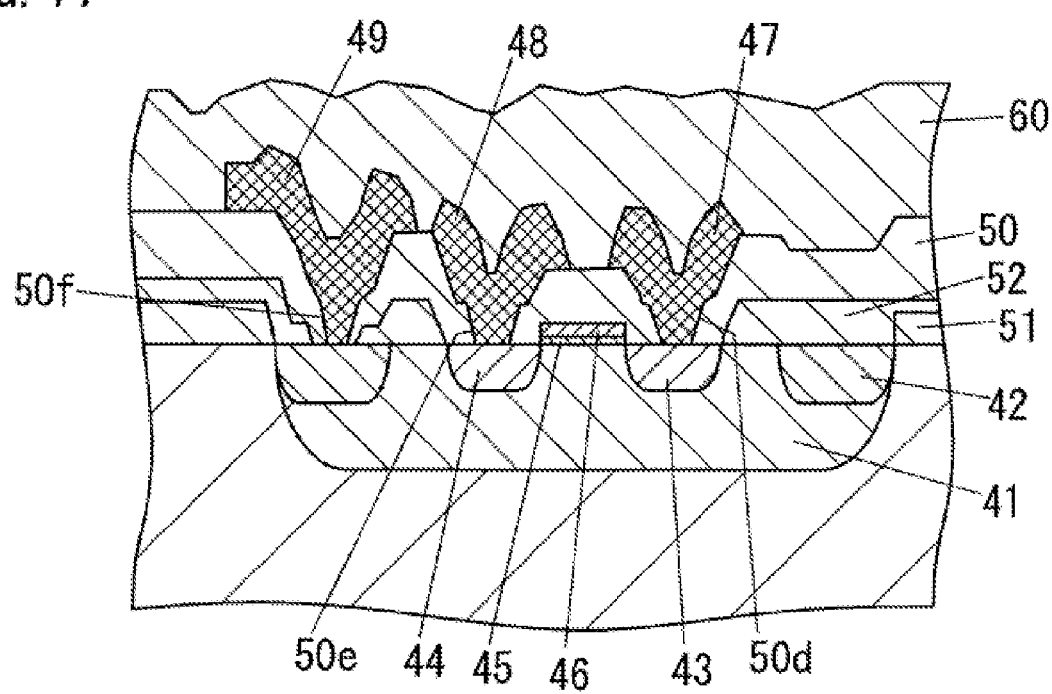
FIG. 11 is a schematic cross sectional view of an essential part of the pixel part in the infrared array sensor.

A MOS transistor 4 is formed in a forming region A2 for MOS transistor 4 of each pixel part 2 in the first surface side of the silicon substrate 1a. As shown in FIGS. 4 and 11, in the MOS transistor 4, a p$^+$ well region 41 is formed on the first surface side of the silicon substrate 1a, and an n$^+$ drain region 43 and an n$^+$ source region 44 are spaced and formed within the p$^+$ well region 41. A p$^{++}$ channel stopper region 42 surrounding the n$^+$ drain region 43 and the n$^+$ source region 44 is also formed within the p$^+$ well region 41. A gate electrode 46 of an n-type polysilicon layer is formed, through a gate insulating film 46 of a silicon dioxide film (thermally-oxidized film), on a part between the n$^+$ drain region 43 and the n$^+$ source region 44 within the p$^+$ well region 41. A drain electrode 47 is formed of metal material (e.g., Al—Si, etc.) and formed on the n$^+$ drain region 43. A source electrode 48 is formed of metal material (e.g., Al—Si, etc.) and formed on the n$^+$ source region 44. In this instance, the gate electrode 46, the drain electrode 47 and the source electrode 48 are separated and insulated by the interlayer dielectric film 50. That is, the drain electrode 47 is electrically connected to the n$^+$ drain region 43 through a contact hole 50d formed in the interlayer dielectric film 50. The source electrode 48 is electrically connected to the n$^+$ source region 44 through the contact hole 50e formed in the interlayer dielectric film 50.

By the way, in each pixel part 2 of the infrared array sensor A in the embodiment, the first end of a thermosensor 30 is electrically connected to the source electrode 48 of a MOS transistor 4, and the second end of the thermosensor 30 is electrically connected to a reference bias line 5. Also, in each pixel part 2 of the infrared array sensor A in the embodiment, the drain electrode 47 of a MOS transistor 4 is electrically connected to a vertical read line 7, and its gate electrode 46 is electrically connected to a horizontal signal line 6 formed of an n-type polysilicon wire continuously integrated with the gate electrode 46. Also, in each pixel part 2, a ground electrode 49 formed of metal material (e.g., Al—Si, etc.) is formed on the p$^{++}$ channel stopper region 42 of a MOS transistor 4, and the ground electrode 49 is electrically connected to a common ground line 8 for element isolation by biasing the p$^{++}$ channel stopper region 42 to make it lower potential than the n$^+$ drain region 43 and the n$^+$ source region 44. The ground electrode 49 is electrically connected to the p$^{++}$ channel stopper region 42 through a contact hole 50f formed in the interlayer dielectric film 50.

A method for manufacturing the infrared array sensor A of the embodiment is now explained with reference to FIGS. 15-18.

First, an insulating layer forming process is performed, and an insulating layer is formed on the first surface side of a silicon substrate 1a, wherein the insulating layer is composed of laminated films of a first silicon dioxide film 31 having a first film thickness (e.g., 0.3 μm) and a silicon nitride film 32 having a second film thickness (e.g., 0.1 μm). An insulating layer patterning process is then performed by photolithography and etching technologies, and a part of the insulating layer, corresponding to a forming region A2 of a MOS transistor 4 is removed by etching so that a part corresponding to a forming region A1 of a thermal-type infrared sensing part 3 is remained. Thereby, the structure shown in FIG. 15A is obtained. In this instance, the silicon dioxide film 31 is formed by thermal oxidation of the silicon substrate 1a at a predetermined temperature (e.g., 1100° C.), and the silicon nitride film 32 is formed by an LPCVD technique.

After the insulating layer patterning process, a well region forming process is performed, and a $p^+$ well region 41 is formed on the first surface side of the silicon substrate 1a. A channel stopper region forming process is then performed, and a $p^{++}$ channel stopper region 42 is formed within the $p^+$ well region 41 at the first surface side of the silicon substrate 1a. Thereby, the structure shown in FIG. 15B is obtained. At the well region forming process, a second silicon dioxide film (thermally-oxidized film) 51 is selectively formed by thermal oxidation of an exposed area at the first surface side of the silicon substrate 1a at a predetermined temperature. Patterning of the silicon dioxide film 51 is then performed by using a mask for forming the $p^+$ well region 41 and photolithography and etching technologies. Drive-in is then performed after ion implant of p-type impurities (e.g., boron, etc.), and thereby the $p^+$ well region 41 is formed. At the channel stopper region forming process, a third silicon dioxide film (thermally-oxidized film) 52 is selectively formed by thermal oxidation of the first surface side of the silicon substrate 1a at a predetermined temperature. Patterning of the third silicon dioxide film 52 is then performed by using a mask for forming the $p^{++}$ channel stopper region 42 and photolithography and etching technologies. Drive-in is then performed after ion implant of p-type impurities (e.g., boron, etc.), and thereby the $p^{++}$ channel stopper region 42 is formed. Incidentally, the first silicon dioxide film 31, the second silicon dioxide film 51 and the third silicon dioxide film 52 constitute a silicon dioxide film 1b on the first surface side of the silicon substrate 1a.

After the channel stopper region forming process, a source and drain forming process is performed, and an $n^+$ drain region 43 and an $n^+$ source region 44 are formed by performing drive after ion implant of n-type impurities (e.g., phosphorus, etc.) into each forming region of the $n^+$ drain region 43 and the $n^+$ source region 44 in the $p^+$ well region 41. After the source and drain forming process, a gate insulating film forming process is performed, and a gate insulating film 45 of a silicon dioxide film (thermally-oxidized film) having a given film thickness (e.g., 600 Å) is formed on the first surface side of the silicon substrate 1a by thermal oxidation. A polysilicon layer forming process is then performed, and a non-doped polysilicon layer having a given film thickness (e.g., 0.69 μm) is formed on the whole first surface side of the silicon substrate 1a by an LPCVD technique, wherein the non-doped polysilicon layer is the basis of gate electrodes 46, horizontal signal lines 6 (see FIG. 1), an n-type polysilicon layer 34, an p-type polysilicon layer 35, an infrared absorption layer 39, a reinforced layer 39b and fault diagnosis wirings 139. A polysilicon layer patterning process is then performed by using photolithography and etching technologies, and the patterning is performed so that each part, of the non-doped polysilicon layer, corresponding to the gate electrodes 46, the horizontal signal lines 6, the n-type polysilicon layer 34, the p-type polysilicon layer 35, the infrared absorption layer 39, the reinforced layer 39b and the fault diagnosis wirings 139 is remained. A p-type polysilicon layer forming process is then performed, and a p-type polysilicon layer 35 is formed by performing drive after ion implant of p-type impurities (e.g., boron, etc.) into part corresponding to a p-type polysilicon layer 35 of the non-doped polysilicon layer. An n-type polysilicon layer forming process is then performed, and the n-type polysilicon layer 34, the infrared absorption layer 39, the reinforced layer 39b, the fault diagnosis wirings 139, the gate electrodes 46 and the horizontal signal lines 6 are formed by performing drive after ion implant of n-type impurities (e.g., phosphorus, etc.) into each part, of the non-doped polysilicon layer, corresponding to the n-type polysilicon layer 34, the infrared absorption layer 39, the reinforced layer 39b, the fault diagnosis wiring 139, the gate electrodes 46 and the horizontal signal lines 6. Thereby, the structure shown in FIG. 16A is obtained. The p-type polysilicon layer forming process and the n-type polysilicon layer forming process may be reverse order.

After completion of the p-type and n-type polysilicon layer forming processes, an interlayer dielectric film forming process is performed, and an interlayer dielectric film 50 is formed on the first surface side of the silicon substrate 1a. A contact hole forming process is then performed by using photolithography and etching technologies, and contact holes $50a_1$, $50a_2$, $50a_3$, $50a_4$, $50d$, $50e$, $50f$ (see FIGS. 8, 9 and 11) are in the interlayer dielectric film 50. Thereby, the structure shown in FIG. 16B is obtained. In the interlayer dielectric film forming process, a BPSG film having a given film thickness (e.g., 0.8 μm) is deposited on the first surface side of the silicon substrate 1a by a CVD technique, and the interlayer dielectric film 50 is then formed by performing reflow at a predetermined temperature (e.g., 800° C.).

After the contact hole forming process, a metal film forming process is performed, and a metal film (e.g., Al—Si film, etc.) having a given film thickness (e.g., 2 μm) is formed on the whole first surface side of the silicon substrate 1a by a sputter technique, wherein the metal film is the basis of connection parts 36, 37, drain electrodes 47, source electrodes 48, reference bias lines 5, vertical read lines 7, ground lines 8, a common ground line 9, pads Vout, Vsel, Vref, Vdd, Gnd, and the like (see FIG. 13). A metal film patterning process for patterning the metal film is performed by photolithography and etching technologies, and connection parts 36, 37, drain electrodes 47, source electrodes 48, reference bias lines 5, vertical read lines 7, ground lines 8, a common ground line 9, pads Vout, Vsel, Vref, Vdd, Gnd, and the like are obtained. Thereby, the structure shown in FIG. 17A is obtained. In this instance, etching in the metal film patterning process is performed by RIE.

After the metal film patterning process, a passivation film forming process is performed, and a passivation film 60 is formed on the first surface side of the silicon substrate 1a (i.e., on the surface side of the interlayer dielectric film 50) by a CVD technique, wherein the passivation film is formed of laminated films of a PSG film having a given film thickness (e.g., 0.5 μm) and an NSG film having a given film thickness (e.g., 0.5 μm). Thereby, the structure shown in FIG. 17B is obtained. However, the passivation film 60 is not limited to the laminated films of the PSG film and the NSG film. For example, the passivation film may be a silicon nitride film.

After the passivation film forming process, a laminated structure patterning process is performed, and the segmented membrane structures 3aa are formed by patterning a laminated structure, wherein the laminated structure is composed of: a thermal insulating layer formed of laminated films of the silicon dioxide film 31 and the silicon nitride film 32; the temperature sensors 30 formed on the thermal insulating layer; the interlayer dielectric film 50 covering the temperature sensors 30 from the surface side of the thermal insulating layer; and the passivation film 60 formed on the interlayer dielectric film 50. Thereby, the structure shown in FIG. 18A is obtained. In the laminated structure patterning process, the aforementioned slits 13, 14 are formed.

After the laminated structure patterning process, an opening forming process is formed by using photolithography and etching technologies, and openings (not shown) for exposing the pads Vout, Vsel, Vref, Vdd, Gnd are formed. A cavity forming process is then performed, and cavities 11 are formed in the silicon substrate 1$a$ through anisotropic etching of the silicon substrate 1$a$ by injecting etching solution through the slits 13, 14 as injection holes of etching solution. Thereby, infrared array sensors A as shown in FIG. 18B are obtained, wherein each infrared array sensor A has a two-dimensional array of pixel parts 2. In this instance, etching in the opening forming process is performed by RIE. In the cavity forming process, TMAH solution heated at predetermined temperature (e.g., 85° C.) is employed as etching solution, but the etching solution is not limited to the TMAH solution. The etching solution may be another alkaline solution (e.g., KOH solution, etc.). All processes are performed at wafer level until the cavity forming process is completed, and after the cavity forming process, a separation process for separating individual infrared array sensors A is performed. As can be seen from the above explanation, a commonly known method for producing MOS transistors is employed as a method for producing the MOS transistors 4, where p$^+$ well regions 41, p$^{++}$ channel stopper regions 42, n$^+$ drain regions 43 and n$^+$ source regions 44 are formed by repeating basic processes of: formation of a thermally-oxidized film by thermal oxidation; patterning of the thermally-oxidized film by photolithography and etching technologies; ion implantation of impurities; and drive-in (impurity diffusion).

In the infrared array sensor A of the embodiment, each pixel part 2 is formed with a cavity 11 in the base substrate 1 in order to thermally insulate an infrared absorption part 33 from the base substrate 1. A membrane structure 3$a$ covering the cavity 11 is also formed, and has an infrared absorption part 33 within the cavity 11 in plane view at the first surface side of the base substrate 1. The membrane structure 3$a$ is divided, by linear slits 13, into segmented membrane structures 3$aa$ which are arranged along a circumferential direction of the cavity 11 and extended inwards from the periphery of the cavity 11 in the base substrate 1. Each segmented membrane structure 3$aa$ is provided with a thermosensor 30$a$, and all of the thermosensors 30$a$ are electrically connected at a relation of connection that output change in response to temperature change becomes large in comparison with the case that each output is separately obtained from each thermosensor 30$a$. Thereby, the response speed and sensitivity are improved. Moreover, coupling pieces 3$c$ are formed and adjoining segmented membrane structures 3$aa$, 3$aa$ are coupled, and thereby it is possible to reduce warping of each segmented membrane structure 3$aa$ to improve the structural safety and stability of sensitivity.

Incidentally, in the infrared image sensor of the aforementioned patent document, the sensor element (thermosensor) is formed of a resistive bolometer. Accordingly, there is a fear that the membrane structure warps by heat stress. Because, when detecting a change in resistance value, applying an electric current is required, which increases electric power consumption and produces self-heating. The resistor temperature coefficient also changes owing to a change in temperature by the self-heating or a change in ambient temperature, and accordingly it is difficult to attain high accuracy if a temperature compensation means is not provided. If the temperature compensation means is provided, the size and cost of the sensor are increased.

In the infrared array sensor A of the embodiment, thermosensors 30$a$ of each pixel part 2 are thermopiles and the aforementioned relation of connection is a series connection. Therefore, in comparison with the case that each thermosensor 30$a$ is formed of a resistive bolometer, there are advantages that prevents warping of each segmented membrane structure 3$aa$ by self-heating, that decreases electric power consumption, and that provides high accuracy and a stable sensitivity regardless of temperature. Because applying an electric current to each thermosensor 30$a$ is not required, and self-heating is not produced. When thermopiles are employed as the thermosensors 30$a$, if all of the thermosensors 30$a$ are connected in series, each thermal electromotive force of the thermosensors 30$a$ is added. Accordingly, the aforementioned relation of connection can be satisfied and the sensitivity is increased. Each thermosensor 30$a$ just needs to be a thermal-type infrared sensing element, and is not limited to a thermopile or a resistive bolometer. Pyroelectric elements may be employed as the thermosensors. When each thermosensor 30$a$ is a pyroelectric element, if pyroelectric elements are connected in parallel, each electric charge generated by a pyroelectric effect is added, and accordingly the aforementioned relation of connection can be satisfied and the sensitivity is increased.

In the infrared array sensor A of the embodiment, each cavity 11 is in the shape of a four-sided pyramid. Accordingly, when a silicon substrate is used as the base substrate 1, each cavity 11 can be easily formed though anisotropic etching by alkaline solution.

In the infrared array sensor A of the embodiment, the infrared absorption layer 39, the reinforced layer 39$b$ and the fault diagnosis wirings 19 besides the n-type polysilicon layer 34 and the p-type polysilicon layer 35 are formed on the infrared entrance side of the silicon nitride film 32. Accordingly, when the n-type polysilicon layer 34 and the p-type polysilicon layer 35 are formed, it is possible to prevent the silicon nitride film 32 from being thinned by etching (in this instance, to prevent the silicon nitride film 32 from being thinned by over-etching when the non-doped polysilicon layer is etched at the polysilicon layer patterning process, wherein the non-doped polysilicon layer is the basis of the n-type polysilicon layer 34 and the p-type polysilicon layer 35). The uniformity of stress balance of each membrane structure 3$a$ can be increased. It is also possible to prevent warping of each segmented membrane structure 3$aa$ while thinning each infrared absorption part 33, and the sensitivity is improved. In this instance, it is necessary to design a shape in plane view so that the n-type polysilicon layer 34, the p-type polysilicon layer 35, the infrared absorption layer 39, the reinforced layer 39$b$ and the fault diagnosis wirings 19 do not expose in inner side surfaces of the slits 13, 14 in order to prevent from being etched by etching solution (e.g., TMAH solution, etc.) used at the cavity forming process.

In the infrared array sensor A of the embodiment, the n-type polysilicon layer 34, the p-type polysilicon layer 35, the infrared absorption layer 39, the reinforced layer 39$b$ and the fault diagnosis wirings 19 are set to the same thickness. Accordingly, the uniformity of stress balance of each segmented membrane structure 3$aa$ is improved, and it is possible to prevent warping of each segmented membrane structure 3$aa$.

In the infrared array sensor A of the embodiment, each pixel part 2 is provided with a MOS transistor 4 for reading out the output of the temperature sensor 30. The number of the output pads Vout can be reduced, and the size and cost can be decreased.

Embodiment 2

Figure 19:
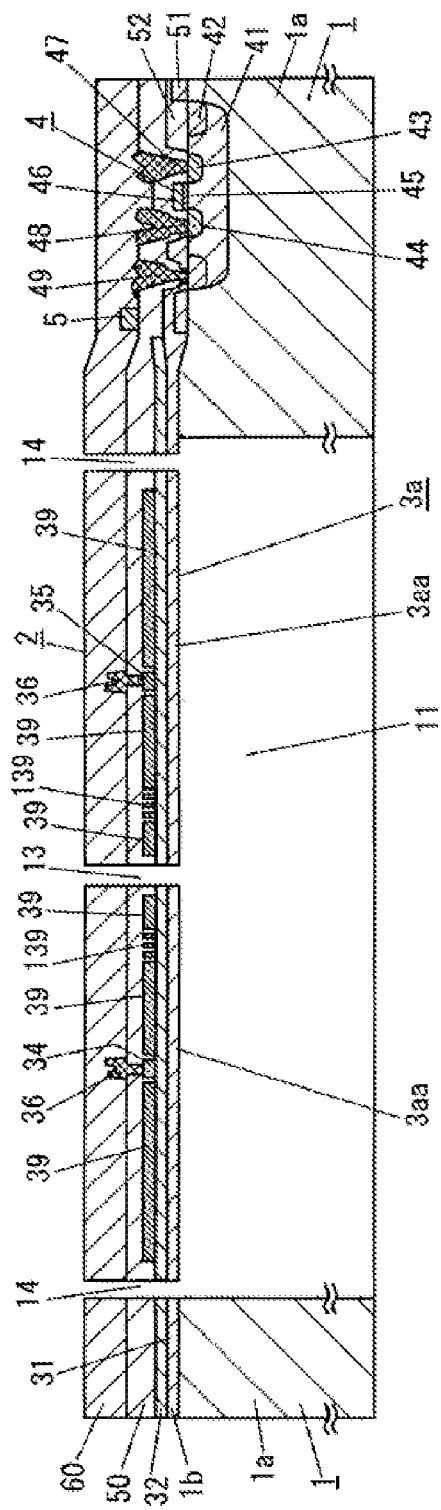
FIG. 19 is a schematic cross sectional view of a pixel part in an infrared array sensor of an embodiment 2.

The basic structure of an infrared array sensor A in the present embodiment is substantially the same as the embodiment 1, but differs in that each cavity 11 in a base substrate 1 is formed from the second surface side of the base substrate 1 as shown in FIG. 19. Like kind elements are assigned the same reference numerals as depicted in the embodiment 1 and are not described in detail herein.

Incidentally, in the embodiment 1, at the cavity forming process for forming each cavity 11, by injecting etching solution through slits 13, 14 from the first surface side of the base substrate 1, each cavity 11 is formed through anisotropic etching of the silicon substrate 1a by utilizing crystal-face dependence of etching speed.

In production of the infrared array sensor A in the embodiment, at a cavity forming process for forming each cavity 11, an anisotropic etching technique using, for example, an ICP (Induction-Coupled Plasma) dry etching apparatus is used for each forming region of cavities 11 in a silicon substrate 1a from the second surface side of the base substrate 1.

In the infrared array sensor of the embodiment, it is possible to suppress heat transfer from each segmented membrane structure 3aa of a membrane structure 3a to the base substrate 1, and the sensitivity is more increased.

Embodiment 3

Figure 20:
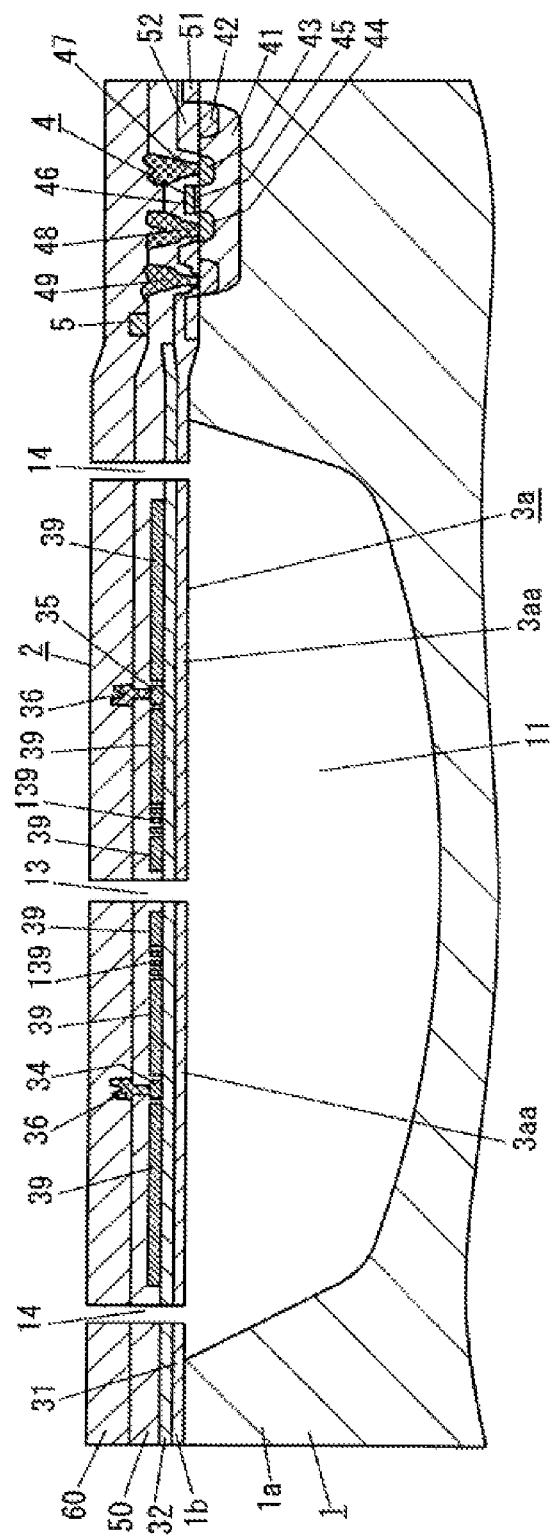
FIG. 20 is a schematic cross sectional view of a pixel part in an infrared array sensor of an embodiment 3.

The basic structure of an infrared array sensor A in the present embodiment is substantially the same as the embodiment 1, but differs in that each inner face of cavities 11 is a concave curve as shown in FIG. 20. Like kind elements are assigned the same reference numerals as depicted in the embodiment 1 and are not described in detail herein.

In the embodiment 1, at the cavity forming process for forming each cavity 11, each cavity 11 is formed through anisotropic etching by utilizing crystal-face dependence of etching speed. In the present embodiment, each cavity 11 is formed through isotropic etching.

In the infrared array sensor A of the embodiment, it is possible to reflect infrared rays penetrating a membrane structure 3a into the membrane structure 3a by the inner face of a cavity 11. Absorbed amount of infrared rays at an infrared absorption part 33 can be increased and sensitivity is improved.

Embodiment 4

Figure 21:
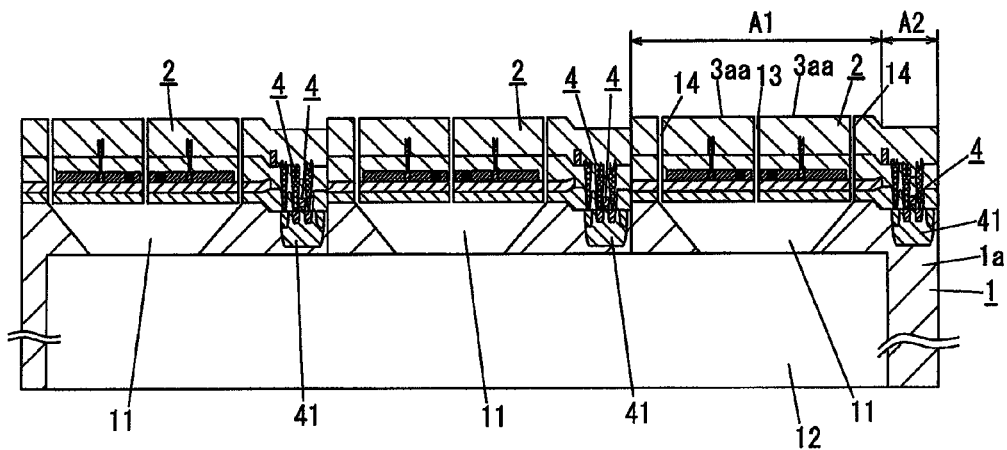
FIG. 21 is a schematic cross sectional view of a pixel part in an infrared array sensor of an embodiment 4.

The basic structure of an infrared array sensor A in the present embodiment is substantially the same as the embodiments 1-3, but differs in that an opening 12 communicating with cavities 11 is formed at the second surface side of a base substrate 1 as shown in FIG. 21. That is, each of the cavities 11 includes an opening at the second surface side of the base substrate 1, and the base substrate 1 has, at the second surface side of the base substrate 1, one opening 12 including the cavities 11. Like kind elements are assigned the same reference numerals as depicted in the embodiments 1-3 and are not described in detail herein.

In this instance, regarding the opening 12 of the base substrate 1, it just needs to utilize an anisotropic etching technique using, for example, an ICP dry etching apparatus for a forming region of the opening 12 in a silicon substrate 1a from the second surface side of the base substrate 1.

In the infrared array sensor A of the embodiment, it is possible to more suppress heat transfer from each segmented membrane structure 3aa of a membrane structure 3a to the base substrate 1, and the sensitivity is more increased.

Embodiment 5

Figure 22:
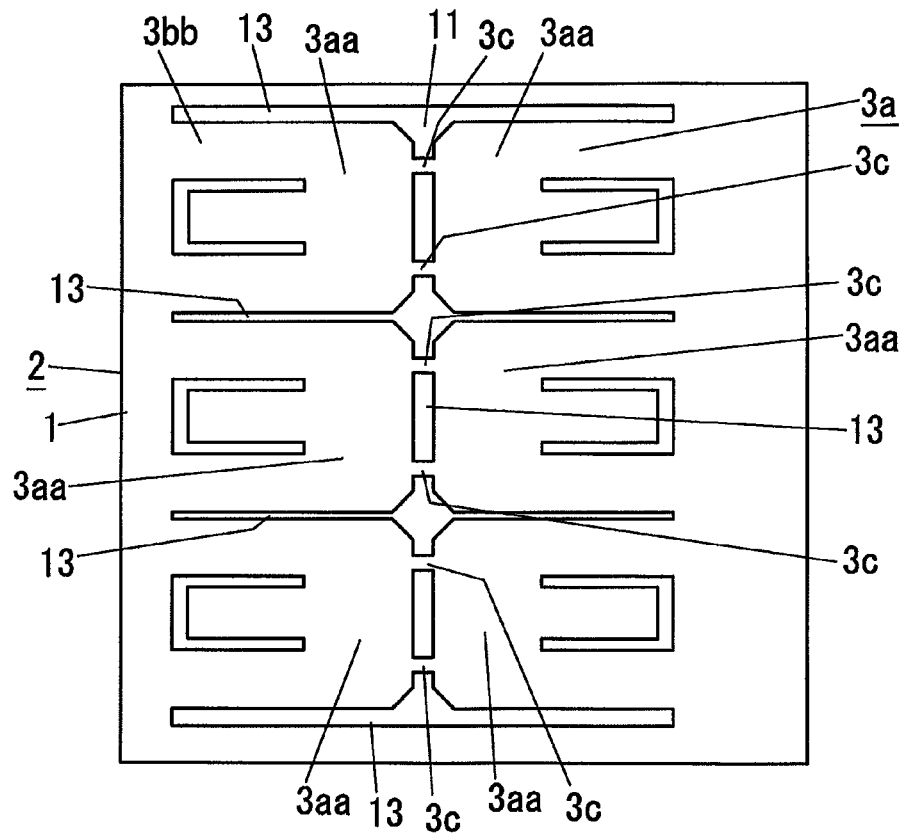
FIG. 22 is a plane layout chart of a pixel part in an infrared array sensor of an embodiment 5.

The basic structure of an infrared array sensor A in the present embodiment is substantially the same as the embodiments 1-4, but differs in that as shown in FIG. 22, segmented membrane structures 3aa, 3aa adjoined in an extended direction of segmented membrane structures 3aa are coupled by coupling pieces 3c. Like kind elements are assigned the same reference numerals as depicted in the embodiments 1-4 and are not described in detail herein.

In the infrared array sensor A of the embodiment, segmented membrane structures 3aa, 3aa adjoined in the extended direction are coupled by two coupling pieces 3c which are spaced in a direction intersecting with the extended direction (i.e., in a width direction of each segmented membrane structure 3aa).

In the infrared array sensor A of the embodiment, segmented membrane structures 3aa, 3aa adjoined in an extended direction of the segmented membrane structures 3aa are coupled by coupling pieces 3c. Accordingly, first end sides of the segmented membrane structures 3aa, 3aa are directly supported by the periphery of a cavity 11 in a base substrate 1, while second end sides are supported by the periphery of the cavity 11 through the coupling pieces 3c and another segmented membrane structure 3aa. As a result, each segmented membrane structure 3aa is supported at both ends by the base substrate 1. Therefore, it is possible to reduce warping of each segmented membrane structure 3aa. The sensitivity is stabilized and fabrication yield is improved. Incidentally, segmented membrane structures 3aa, 3aa adjoined in the extended direction may be coupled by one coupling piece 3c at the middle of a width direction of each segmented membrane structure 3aa.

Embodiment 6

Figure 23:
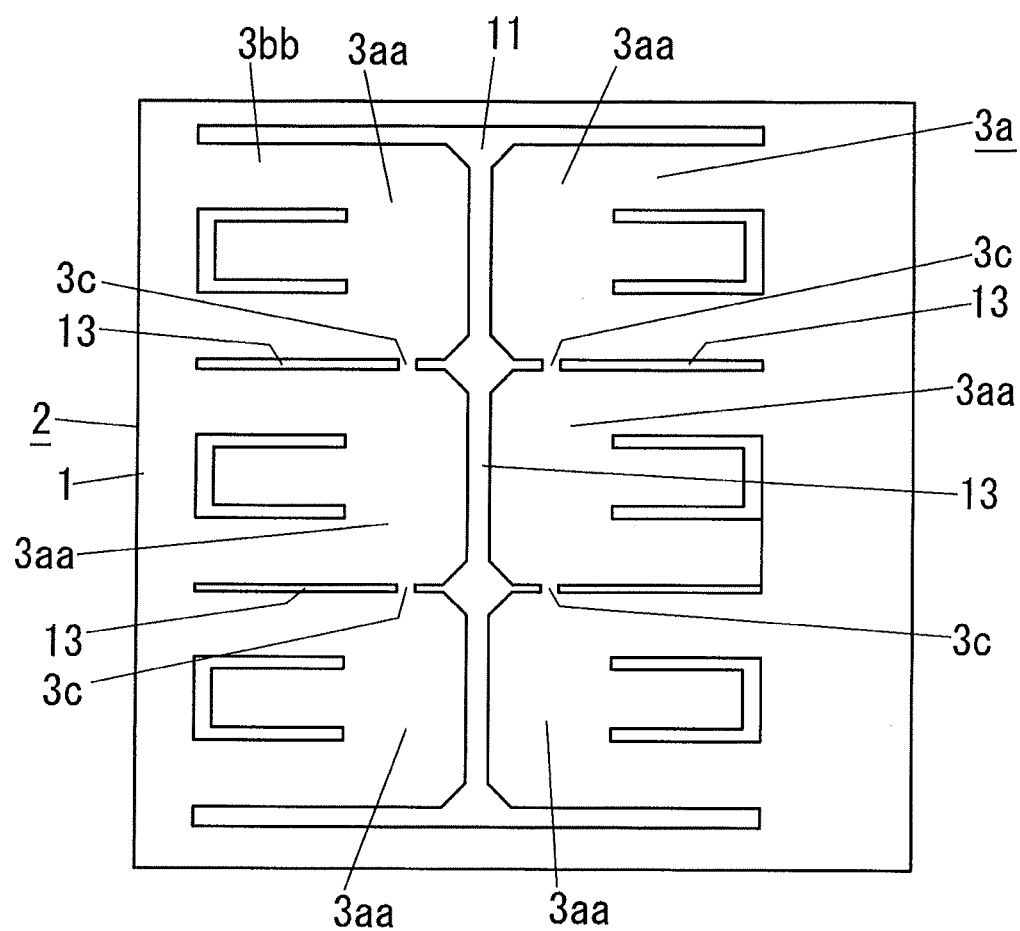
FIG. 23 is a plane layout chart of a pixel part in an infrared array sensor of an embodiment 6.

The basic structure of an infrared array sensor A in the present embodiment is substantially the same as the embodiments 1-4, but differs in that as shown in FIG. 23, adjoining segmented membrane structures 3aa, 3aa adjoined in a direction perpendicular to an extended direction of segmented membrane structures 3aa (in a width direction of each segmented membrane structure 3aa, namely in a vertical direction of FIG. 23) are coupled by a coupling piece 3c. Like kind elements are assigned the same reference numerals as depicted in the embodiments 1-4 and are not described in detail herein.

In the infrared array sensor A of the embodiment, segmented membrane structures 3aa, 3aa adjoined in the direction perpendicular to the extended direction are coupled by one coupling piece 3c at a part except for bridge parts 3bb. It is preferable that each coupling piece 3c is placed at a point distant from each bridge part 3bb.

In the infrared array sensor A of the embodiment, segmented membrane structures 3aa, 3aa adjoined in the direction perpendicular to the extended direction of the segmented membrane structures 3aa are coupled by a coupling piece 3c. Accordingly, torsional stiffness of each segmented membrane structure 3aa is increased, and deformation of each segmented membrane structure 3aa can be reduced. The sensitivity is stabilized and fabrication yield is improved.

Embodiment 7

Figure 24:
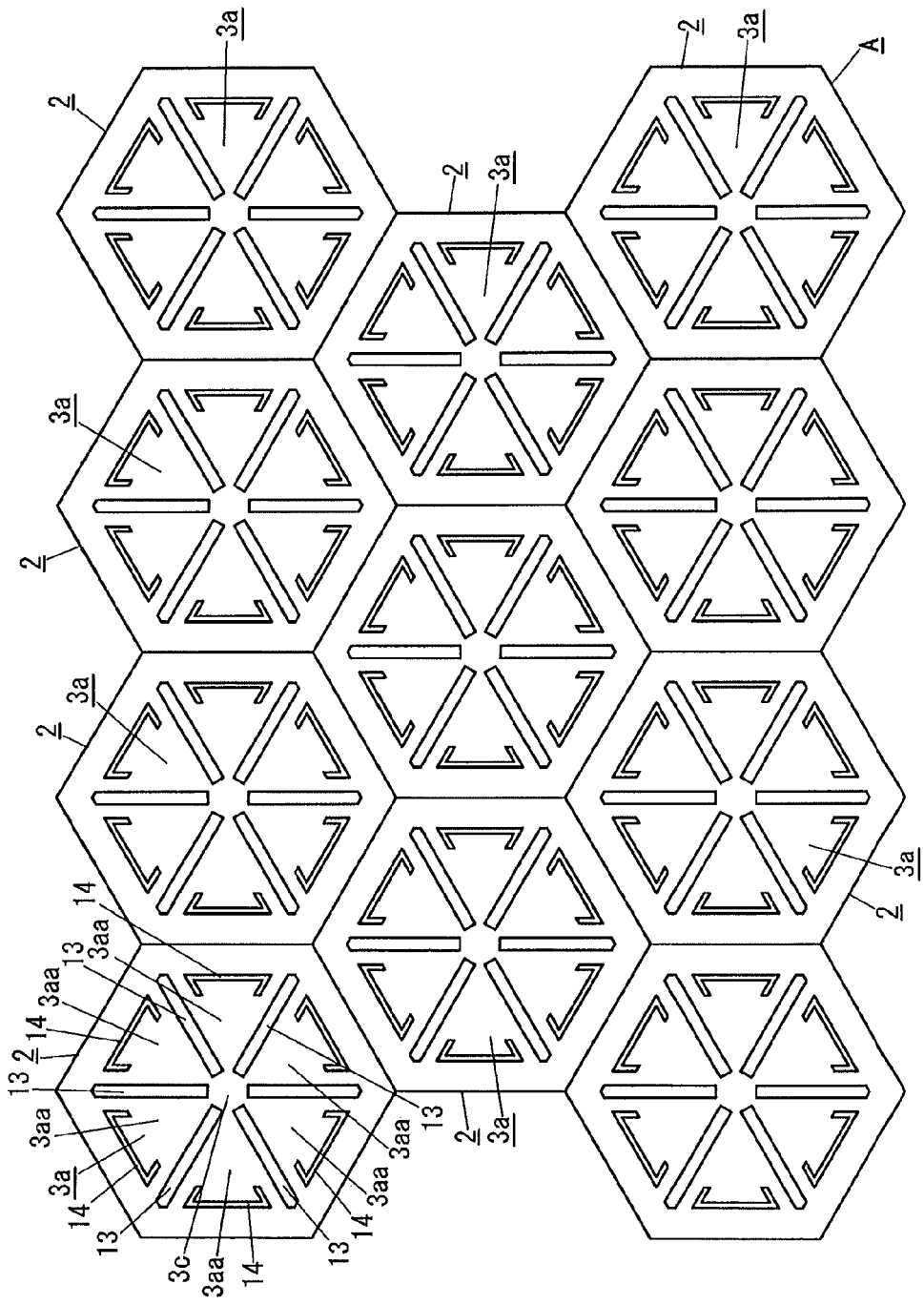
FIG. 24 is a plane layout chart of a pixel part in an infrared array sensor of an embodiment 7.
Figure 25:
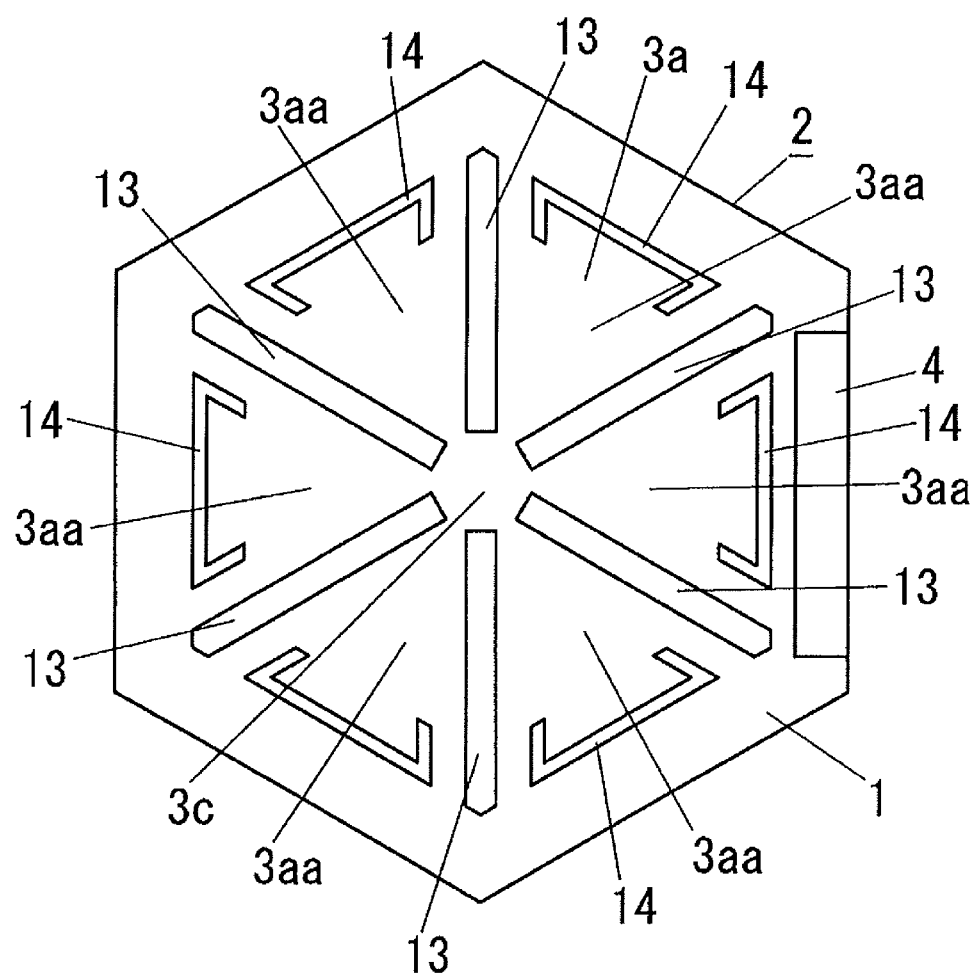
FIG. 25 is an enlarged view of an essential part in the plane layout chart of the pixel part.

The basic structure of an infrared array sensor A in the present embodiment is substantially the same as the embodiments 1-6, but differs in that as shown in FIGS. 24 and 25, each pixel part 2 is a hexagonal shape in plane view and arranged in a honeycomb structure. Like kind elements are assigned the same reference numerals as depicted in the embodiments 1-6 and are not described in detail herein.

A membrane structure 3a in the embodiment is divided, by six slits 13, into six segmented membrane structures 3aa which are coupled together by a coupling piece 3c.

The infrared array sensor A of the embodiment can prevent deformation of each segmented membrane structure 3aa and increase configuration density of pixel parts 2.

In each infrared array sensor A of the aforementioned embodiments, each pixel part 2 is provided with a MOS transistor 4, but need not necessarily include a MOS transistor 4.

Although the present invention has been described with reference to certain preferred embodiments, numerous modifications and variations can be made by those skilled in the art without departing from the true spirit and scope of this invention, namely claims.

The invention claimed is:

1. An infrared array sensor, comprising:
a base substrate comprising first and second surfaces;
cavities which have array structure and are formed on the first surface side of the base substrate; and
pixel parts which are supported by the base substrate to cover the cavities, respectively, each of the pixel parts comprising a membrane structure,
wherein each membrane structure of the pixel parts comprises segmented membrane structures divided by slits, each of the segmented membrane structures comprising a thermosensor,
wherein each membrane structure of the pixel parts comprises a coupling piece for coupling its own segmented membrane structures to each other.

2. The infrared array sensor of claim 1, wherein each membrane structure of the pixel parts comprises thermosensors that are electrically connected to each other so that a sum of each absolute value output of the thermosensors is obtained.

3. The infrared array sensor of claim 1,
wherein each thermosensor of the pixel parts is a thermopile;
wherein thermosensors of each membrane structure of the pixel parts are electrically connected in series to each other so that a sum of each absolute value output of the thermosensors is obtained.

4. The infrared array sensor of claim 1,
wherein each of said segmented membrane structures is supported by the base substrate through a bridge part,
wherein said bridge part and the segmented membrane structure supported by the base substrate therethrough are in the shape of a rectangle surrounded by two or three slits, and
wherein said two or three slits are divided by one or two coupling pieces.

5. The infrared array sensor of claim 4,
wherein each inner circumference of the cavities is in the shape of a rectangle,
wherein said segmented membrane structures comprise two segmented membrane structures arranged so as to approach to each other from both sides of an opening of a corresponding cavity, and
wherein said two segmented membrane structures are coupled to each other by said one or two coupling pieces.

6. The infrared array sensor of claim 4,
wherein each inner circumference of the cavities is in the shape of a rectangle,
wherein said segmented membrane structures comprise two segmented membrane structures laying next to each other along one side of an opening of a corresponding cavity, and
wherein said two segmented membrane structures are coupled to each other by said one coupling piece.

7. The infrared array sensor of claim 4, wherein chamfer parts are formed between both side edges of said coupling piece and a side edge of the segmented membrane structure, respectively.

8. The infrared array sensor of claim 4, wherein the coupling piece comprises a reinforced layer for reinforcing the coupling piece.

9. The infrared array sensor of claim 1, wherein each of the cavities is in the shape of a four-sided pyramid.

10. The infrared array sensor of claim 1, wherein each of the cavities comprises an opening at the second surface side of the base substrate.

11. The infrared array sensor of claim 10, wherein the base substrate comprises an opening including the cavities at the second surface side of the base substrate.

12. The infrared array sensor of claim 1, wherein each inner face of the cavities is a concave curve.

* * * * *